United States Patent [19]

Yamada et al.

[11] Patent Number: 5,642,286

[45] Date of Patent: Jun. 24, 1997

[54] WIRING CAD APPARATUS

[75] Inventors: Ryoji Yamada; Masaharu Nishimura; Yasuhiro Yamashita; Kazuyuki Iida, all of Kawasaki, Japan

[73] Assignee: Fujitsu Limited, Kawasaki, Japan

[21] Appl. No.: 497,550

[22] Filed: Jun. 30, 1995

[30] Foreign Application Priority Data

Nov. 30, 1994 [JP] Japan ................... 6-296470

[51] Int. Cl.⁶ .................. G06F 17/50; G06F 19/00
[52] U.S. Cl. .................. 364/468.03; 364/468.28; 364/491
[58] Field of Search ............ 364/468.03, 468.04, 364/468.28, 474.24, 488, 489, 490, 491

[56] References Cited

U.S. PATENT DOCUMENTS

| | | | |
|---|---|---|---|
| 4,864,514 | 9/1989 | Yamanaka et al. | 364/488 X |
| 5,187,668 | 2/1993 | Okude et al. | 364/491 X |
| 5,247,455 | 9/1993 | Yoshikawa | 364/490 |
| 5,309,371 | 5/1994 | Shikata et al. | 364/490 X |
| 5,353,234 | 10/1994 | Takigami | 364/488 X |

FOREIGN PATENT DOCUMENTS

| | | |
|---|---|---|
| 1-239672 | 9/1989 | Japan . |
| 1-292473 | 11/1989 | Japan . |
| 2-108161 | 4/1990 | Japan . |
| 2-197147 | 8/1990 | Japan . |
| 3-18977 | 1/1991 | Japan . |
| 3-46071 | 2/1991 | Japan . |
| 3-99371 | 4/1991 | Japan . |
| 4-111074 | 4/1992 | Japan . |
| 4-151774 | 5/1992 | Japan . |
| 4-156678 | 5/1992 | Japan . |
| 4-218874 | 8/1992 | Japan . |
| 5-6412 | 1/1993 | Japan . |
| 5-266137 | 10/1993 | Japan . |

*Primary Examiner*—Joseph Ruggiero
*Attorney, Agent, or Firm*—Staas & Halsey

[57] ABSTRACT

A wiring CAD apparatus wherein a situation of a noticed event can be identified at a moment on a screen. The wiring CAD apparatus comprises a searching timing detection section for detecting a new displaying processing/deletion processing timing as a searching timing for a non-wired pin, a non-wired pin searching section operable in response to the searching timing detected by said searching timing detection section for searching the non-wired pin, and a display data production section for producing display data in accordance with which the non-wired pin searched out by said non-wired pin searching section is to be displayed on a display section in a visually distinguishable condition from another already wired part pin. The display data produced by said display data production section is displayed on the display section under the control of a displaying control section. The wiring CAD apparatus can be applied to a CAD system with which wiring designing for an LSI, an MCM, a PWB or the like can be performed interactively.

12 Claims, 19 Drawing Sheets

WIRING CAD APPARATUS

BACKGROUND OF THE INVENTION

1. Field of the Invention

This invention relates to a CAD (Computer-Aided Design) apparatus with which a large scale integrated circuit (LSI), a multi-chip module (MCM), a printed wiring board (PWB) or a like apparatus is designed interactively, and more particularly to a CAD apparatus which is improved in technique of displaying a design object.

2. Description of the Related Art

In recent years, it is demanded for an LSI, an MCM, a PWB or a like device to have parts mounted in a high density and be wired with a reduced number of signal layers in a short time. Therefore, wiring lines for an LSI, an MCM, a PWB or a like apparatus are usually designed interactively displaying a design object on a display unit using a wiring CAD apparatus such as a computer graphics system. In this instance, it is required to establish a displaying technique by which existing components, connections between the components and so forth can be identified readily to proceed with interactive processing with reduced steps of operation.

A popular displaying technique for a wiring design object in a wiring CAD apparatus such as a computer graphics system will be described below with reference to FIGS. 26 to 33.

A1. In a wiring CAD apparatus which operates interactively, a part pin which is not wired yet (such pin will be hereinafter referred to as non-wired pin) is recognized in the following manner, for example, in accordance with a flow chart (steps S81 to S85) shown in FIG. 26.

In particular, a designer (operator) will first input an "instruction to display a non-wired pin" by way of an inputting apparatus such as a keyboard, a mouse or a tablet (step S81). Consequently, the wiring CAD apparatus automatically searches a non-wired line from among wiring design data inputted prior to the inputting time of the instruction (step S82) and determines whether or not a pertinent pin, that is, a non-wired pin, remains (step S83).

When a non-wired pin remains (when the determination at step S83 is YES), in order to make clear the positional relationship between the non-wired pin and another pin to which the non-wired pin is to be wired, display data for displaying a line or the like which interconnects the non-wired pin and the connection object pin is produced (step S84). The non-wired pin is displayed on a display unit based on the display data, and the connection object pin to be paired with the non-wired pin is displayed connected by way of a suitable line (step S85). For example, as shown in FIG. 28, between a non-wired pin 100 and a connection object pin 101 to be connected to the non-wired pin 100, a broken line 102 interconnecting the pins 100 and 101 is displayed.

In this instance, the non-wired pin can be displayed in various forms including ① a displaying form wherein, by hitting a part pin displayed on the display unit by means of a mouse pointer or a like element, a line or a like element interconnecting the thus hit part pin and a non-wired pin to be connected to the part pin by a wiring line is displayed; ② another displaying form wherein, by hitting a part displayed on the display unit by means of a mouse pointer or a like element, lines or the like interconnecting pins of the part and a non-wired pin or pins to be connected to the pins are displayed; and ③ a further form wherein, by operating a function key or a like element on an inputting apparatus or the like, lines or the like interconnecting all non-wired pins in an entire wiring design object at present and all part pins to be connected to the non-wired pins are displayed.

A2. Further, in a wiring CAD apparatus which operates interactively, a wiring pattern which is not connected to any element (such wiring pattern will be hereinafter referred to as non-connected pattern) or an end portion of such non-connected pattern is recognized in the following manner, for example, in accordance with a flow chart (steps S86 to S90) shown in FIG. 27. It is to be noted that such a non-connected pattern as described above appears, for example, in such a case that, after two part pins are connected to each other once, the opposite end portions of the wiring pattern are deleted by deletion processing or the like.

Referring to FIG. 27, a designer will observe a screen displayed on the display unit at present and, taking notice of an arbitrary region of a wiring design object on the display unit, operate the inputting apparatus so as to display the region in an increased scale (step S86). Then, the designer will observe the region displayed in the increased scale on the display unit to visually search a pertinent non-connected pattern (step S87) and visually discern whether or not a pertinent non-connected pattern is present (step S88).

If no pertinent non-connected pattern is present in the region displayed on the display unit (when the determination at step S88 is NO), the designer will operate the inputting apparatus to scroll the screen so that another region of the wiring design object is displayed on the display unit (step S89), and perform similar operations to those at steps S87 and S88 described above.

In contrast, when it is determined at step S88 that a pertinent non-connected pattern is present (when the determination at step S88 is YES), the designer will perform next processing such as to delete the non-connected pattern or connect the non-connected pattern to a predetermined part pin (step S90).

It is to be noted that, although the software for automatically searching such a non-connected pattern as described above has conventionally been developed, according to the software, a result of automatic searching is outputted merely as coordinate information of non-connected patterns in the form of a list, and the non-connected patterns thus searched out cannot be discriminated immediately.

A3. Further, in a wiring CAD apparatus which operates interactively, a wiring pattern which has a non-wired interval (such wiring pattern will be hereinafter referred to as non-wired pattern; a wiring pattern which is connected at an end thereof to a part pin but is not connected at the other end thereof) or an end portion of such non-wired pattern is recognized in the following manner, for example, in accordance with the procedure according to the flow chart (steps S81 to S85) shown in FIG. 26 described above and another flow chart (steps S91 to S95) shown in FIG. 29 which will be described below.

That a non-wired pattern is present signifies that such a non-wired pin as described above is present, and accordingly, after a non-wired pin is searched out and displayed in accordance with the procedure described hereinabove with reference to FIG. 26, the non-wired pattern is visually searched on the display unit in accordance with the procedure illustrated in FIG. 29.

In particular, a designer will input an "instruction to display a non-wired pattern" by way of the inputting apparatus (step S81). Consequently, a non-wired pattern is automatically searched based on wiring design data obtained up to the inputting point of time of the instruction (step S82)

and it is determined whether or not a non-wired pin is present (step S83) as described above. If a non-wired pin is present, then such non-wired pin 100 and a connection object pin 101 are displayed connected to each other by way of a broken line (steps S84 and S85).

After a non-wired pin is searched out and displayed as described above, the designer will observe the screen (for example, FIG. 28) which displays the non-wired pin on the display unit, and taking the broken line 102 and so forth into consideration, take notice of an arbitrary region of the wiring design object and operate the inputting apparatus so as to display the region in an increased scale (step S91). Then, the designer will observe the region displayed in the increased scale on the display unit to visually search a pertinent non-wired pattern (step S92) and visually discern whether or not a pertinent wiring pattern is present (step S93).

When no pertinent non-wired pattern is present in the region displayed on the display unit (when the determination at step S93 is NO), the designer will operate the inputting apparatus so as to scroll the screen so that another region of the wiring design object on the display unit (step S94), and then perform similar processing to that at steps S91 and S92 described above.

On the contrary if it is determined at step S93 that a pertinent non-wired pattern is present (when the determination is YES), the designer will perform next processing such as to connect the non-wired pattern to a predetermined part pin (step S95).

Now, a detailed example of searching processing for a non-wired pattern will be described with reference to FIG. 28. It is assumed that, as shown in FIG. 28, the non-wired pin 100 and the connection object pin 101 are displayed connected to each other by way of the broken line 102 and the designer first tries to display the region defined by a rectangular frame 104A, which includes the non-wired pin 100, in an increased scale.

In this instance, the designer will move the displaying screen on the display unit along the broken line 102 until the region in another rectangular frame 104B is displayed in an enlarged scale, and thereupon, the designer will visually discern the pin 101 which is an object of connection of the non-wired pin 100. Thereafter, the designer will visually trace a wiring pattern 103 connected to the pin 101 to visually discern that the wiring pattern 103 is a non-wired pattern. The designer can further move the displaying screen and, at a point of time when the region in a further rectangular frame 104C is displayed in an enlarged scale, confirm the position of an end 103a of the non-wired pattern 103.

A4. On the other hand, when wiring patterns in a plurality of layers are displayed at a time on a display unit of a wiring CAD apparatus, the different layers are displayed in different displaying colors. As shown in FIG. 30, wiring patterns 105 of a first layer (L1) are displayed, for example, in blue (screened displaying portion in FIG. 30); wiring patterns 106 of a second layer (L2) are displayed, for example, in red (in FIG. 30, indicated by slanting lines); and a further wiring pattern 107 of a third layer (L3) is displayed, for example, in yellow (in FIG. 30, indicated in blank).

In this instance, the wiring patterns 105 to 107 of the different layers are displayed successively in an overlapping relationship from the uppermost layer (or lowermost layer) toward the lower layers (or upper layers).

Accordingly, in the example shown in FIG. 30, the wiring patterns 105 of the first layer are displayed uppermost (on the nearest side), and the wiring patterns 106 of the second layer are displayed under the wiring patterns 105 of the first layer. Further, the wiring pattern 107 of the third layer is displayed under the wiring patterns 106 of the second layer 106. Thus, where wiring patterns of different layers are present in an overlapping relationship with each other, the wiring layer of an uppermost layer is displayed preferentially.

Further, in another example shown in FIG. 31(a), wiring patterns 105A to 105D of a first layer are displayed, and another wiring pattern 106A of a second layer is displayed under the wiring patterns 105A to 105D of the first layer. The wiring pattern 106A of the second layer is overlapped partially with the wiring pattern 105B of the first layer and is connected to the wiring pattern 105D of the first layer by way of a via hole (or IVH (Interstitial Via Hole)) 109.

As seen in FIG. 31(a), the via hole (or IVH) 109 which extends between the different layers is displayed as a single graphic form on the display unit. Further, in order for the wiring pattern 106A of the second layer, which cannot be observed due to the presence of the wiring patterns 105A to 105D of the first layer, to be visually discerned on the display unit, a designer conventionally operates an inputting apparatus to erase the displays of the wiring patterns 105A to 105D of the first layer so that the wiring pattern 106A of the lower layer is displayed in the uppermost layer as seen, for example, from FIG. 31(a).

It is to be noted that each of rectangular portions each denoted at 108 in FIGS. 30 and 31(a) is a region called pad. The pads 108 are provided on a chip for an integrated circuit or semiconductor elements such transistors so as to allow wiring from the outside to the chip.

Meanwhile, the IVH (Interstitial Via Hole) mentioned hereinabove is a generic term for blind via holes formed only in an outer layer material of a multi-layer printed wiring board and inner via holes formed only in an inner layer material, and is a plated through-hole which interconnects two or more conductor layers of a multi-layer printed wiring board but does not extend through the printed wiring board, different from a via hole. By connecting only necessary layers to each other by way of such IVH, the degree of freedom in designing and the mounting density can be raised.

A5. In the meantime, when it is attempted to perform a wiring operation on a display unit of a wiring CAD apparatus, if a start point 110 from which wiring is to be started is designated by hitting it by means of a mouse pointer (or cursor) 111 as seen in FIG. 32, then a rubber band 112 is continuously displayed between the start point 110 and the mouse pointer 111 and consequently the positional relationship between the start point 110 and the mouse pointer 111 is continuously indicated clearly until after an end point (not shown) of the wiring line is designated by hitting it by means of the mouse pointer 111.

After the start point and the end point of a wiring interval are designated in such a manner as described above, wiring processing of the wiring interval is executed in the wiring CAD apparatus. However, if actual wiring processing reveals that wiring cannot be performed actually for the wiring interval because of presence of some obstacle or from some other cause, then an error message or the like is displayed on the display unit to inform the designer of it. The designer thus observes the error message and takes a suitable countermeasure so as to make it possible to perform wiring of the wiring interval.

It is to be noted that the obstacle mentioned above may be, for example, a location which looks on the display unit as if a wiring pattern can be disposed there but at which a wiring pattern cannot be disposed actually because more than an allowable number of wiring patterns pass there.

A6. Further, when it is tried to perform an operation of deleting a pattern wired once on the display unit of the wiring CAD apparatus, for example, a deletion start point 113 and a deletion end point 114 on a wiring pattern 115 as an object for deletion are designated by hitting them by means of a mouse pointer or cursor as seen in FIG. 33. In this instance, in order to clearly indicate the positions of the deletion start point 113 and the deletion end point 114 on the display unit, such a mark as "x" is displayed at each of the deletion start point 113 and the deletion end point 114 simultaneously upon designation of the points 113 and 114, respectively.

However, the existing techniques described hereinabove in the items A1 to A6 have such subjects to be solved as described in items B1 to B6 below, respectively.

B1. When a non-wired pin is searched, in the displaying form ① or ② described hereinabove wherein a non-wired pin is displayed for each part pin or each part, a designer must operate the inputting apparatus to input an instruction and must perform such processing as described above with reference to FIG. 26 repetitively by a number of times. Accordingly, a very long time is required for the operation. Further, since a non-wired pin is not displayed if such an instruction as described above is not inputted, there is the possibility that, while a non-wired pin remains, the wiring designing may be completed.

Meanwhile, in the displaying form ③ described hereinabove, since lines or the like which interconnect all non-wired pins in the entire wiring design object and all part pins to be connected to the non-wired pins are displayed simultaneously on the display unit, they make the displaying screen so complicated that the individual non-wired pins cannot still be conformed. Also in this instance, there is the possibility that the wiring designing may be completed while a non-wired pin remains.

B2. When a non-connected pattern is searched, since such processing as to take notice of an arbitrary region and search a non-connected pattern by visual discernment by the designer must be repeated, a very long time is required for the searching operation, and there is the possibility that the wiring designing may be completed while a non-connected pattern remains. Particularly, a non-connected pattern sometimes remains as a fraction, and in such an instance, it is very difficult to search out the non-connected pattern from a wiring design object of a large area.

B3. When a non-wired pattern is searched, a non-wired pin is first searched in accordance with the procedure described hereinabove with reference to FIG. 26 and displayed in such a manner as shown in FIG. 28, and then, while the display of the broken line 102 or the like on the display unit is observed, the positions of the non-wired pattern 103 and the end 103a of the non-wired pattern 103 must be searched as described hereinabove with reference to FIG. 29. Thus, a very long time is required for the searching operation.

B4. Further, in the existing displaying techniques described hereinabove, since wiring patterns of a plurality of layers and via holes or IVHs which extend through a plurality of layers are displayed successively in an overlapping relationship from the uppermost layer (or lowermost layer) toward the lower (or upper) layers as shown in FIGS. 30 and 31(a), where such a visual obstacle as a pad 108 is displayed on the first (uppermost or surface) layer, it makes it very difficult to recognize wiring patterns in the other layers (lower layers).

Particularly, where a plurality of wiring patterns are present at the same position but in different layers as seen in FIG. 31(a), the wiring patterns are displayed in an overlapping relationship with each other, and consequently, only the wiring pattern (105B) in the uppermost layer is displayed on the screen. Accordingly, it is difficult to identify the conditions of the wiring patterns in the other layers at a moment. Also it is difficult to identify at a moment from which layer to which layer a via hole or IVH (refer to reference numeral 109), which extends across a plurality of layers, extends.

Therefore, also it has been a common practice to designate a displaying layer and delete the display or displays of an upper layer or layers, for example, in such a manner as shown in FIG. 31(b) so as to provide displays for the individual layers to facilitate recognition. However, such operation is very complicated and cumbersome. Besides, if the display of an upper layer is deleted, this makes it impossible to grasp the association with a lower layer or layers immediately, resulting in deterioration in efficiency in wiring designing.

B5. Upon wiring operation, as shown, for example, in FIG. 32, the rubber band 112 is displayed extending from the start point 110 to the mouse pointer (or cursor) 111. In this instance, however, if only the region in the rectangular frame 116 is displayed on the display unit and the end point of the wiring interval is present outside the rectangular frame 116, then although the mouse pointer 111 must be moved to the position of the end point, the position of the end point, that is, the direction from the mouse pointer 111 to the end point, cannot be recognized. Consequently, the positional relationship between the start point and the end point or the direction from an intermediate location of a wiring line (the position of the mouse pointer 111) to the end point must be investigated, which requires much time.

Meanwhile, since a pattern of a noticed network cannot be identified depending upon the magnification of a wiring design object on the display unit, there is the possibility that, upon T-junction processing (processing of directly connecting a new pattern in a T-shaped configuration to another pattern wired already), an end point may be designated on a pattern of a network different from the pattern whose start point 110 has been designated. In such an instance, an error message or the like is displayed on the display unit, and the designer will observe the error message or the like and perform wiring instruction again.

Further, after a start point of a wiring interval is designated, to which location a wiring line can be wired from the start point cannot be determined unless an end point is designated actually. In particular, if an error message is not displayed, upon designation of a start point and an end point, on the display unit and predetermined wiring processing is executed for the designated wiring interval, then it becomes clear at the point of time that wiring is possible. However, if an error message is displayed on the display unit when a start point and an end point are designated, then it becomes clear at the point of time that wiring is impossible for the designated wiring interval.

Then, when wiring is impossible, merely an error message is displayed on the display unit, but the indication of what or where is a location for which wiring is impossible due to an obstacle or the like is not provided conventionally. Consequently, the designer cannot recognize which portion makes wiring impossible.

Although a skilled person can recognize, on its sixth sense, a location for which wiring is impossible to some degree, since the location for which wiring is impossible is not displayed at all, after all it is a common practice to determine a location of an obstacle or the like by supposition, wire a wiring line bypassing the location and thus attempt a wiring operation while confirming that an error message is not displayed as result of the wiring. This deteriorates the wiring operation efficiency.

B6. Upon operation of deleting a wiring pattern, for example, marks are applied to the positions of the deletion start point 113 and the deletion end point 114 as shown in FIG. 33 to designate a deletion interval of the wiring pattern 115. However, where a wiring design object is complicated and is high in mounting density, the deletion end point 114 may possibly be designated on a pattern of a network different from the network whose deletion start point 113 is designated. In such an instance, an error message or the like is displayed on the display unit, and the designer will observe the error message or the like and input a deletion instruction again.

SUMMARY OF THE INVENTION

It is an object of the present invention to provide a wiring CAD apparatus wherein a situation of a noticed event (a non-wired pin, a non-connected pattern, a non-wired pattern, a wiring pattern of another layer, a processing object network or the like) can be identified at a moment on a screen to achieve improvement in operability and reduction in time for wiring designing.

In order to attain the object described above, according to an aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a searching timing detection section for detecting a new displaying processing timing at which new wiring design data is to be displayed on the display section or a deletion processing timing at which part of wiring design data displayed on the display section is to be deleted as a searching timing for a non-wired pin which is a part pin which is not wired on the wiring design object, a non-wired pin searching section operable in response to the searching timing detected by the searching timing detection section for searching the non-wired pin on the wiring design object from among display data to the display section, and a display data production section for producing display data in accordance with which the non-wired pin searched out by the non-wired pin searching section is to be displayed on the display section in a visually distinguishable condition from another already wired part pin, the display data produced by the display data production section being displayed on the display section under the control of the displaying control section.

With the wiring CAD apparatus, since the designer can normally identify a non-wired pin at a moment on the display section without the necessity of inputting an instruction every time to display a non-wired pin as with a conventional wiring CAD apparatus, the wiring CAD apparatus is advantageous in that improvement in operability and reduction in time for wiring designing can be achieved and such a situation that wiring designing is completed while a non-wired pin remains can be prevented with certainty.

According to another aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a non-connected pattern searching section for searching, from among display data to the display section, a non-connected pattern which is a wiring pattern connected to no element on the wiring design object, and a display data production section for producing display data in accordance with which the non-connected pattern searched out by the non-connected pattern searching section is to be displayed on the display section in a visually distinguishable condition from any other wiring pattern, the display data produced by the display data production section being displayed on the display section under the control of the displaying control section. The display data production section may produce display data in accordance with which a mark for clearly indicating an end of the non-connected pattern searched out by the non-connected pattern searching section is to be additionally displayed on the display section at each of the opposite ends of the non-connected pattern.

With the wiring CAD apparatus, the designer can identify a non-connected pattern or the opposite ends of such non-connected pattern at a moment on the display section without the necessity of repeating searching by visual discernment as with a conventional wiring CAD apparatus. Consequently, the wiring CAD apparatus is advantageous in that improvement in operability and reduction in time for wiring designing can be achieved and such a situation that wiring designing is completed before processing of deleting a wiring pattern or the like is performed can be prevented with certainty.

According to a further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a non-wired pattern searching section for searching, from among display data to the display section, a non-wired pattern which is a wiring pattern which forms a non-wired interval on the wiring design object, and a display data production section for producing display data in accordance with which a line interconnecting an end of the non-wired pattern searched out by the non-wired pattern searching section and a part pin to which the non-wired pattern is to be connected is to be displayed on the display section, the display data produced by the display data production section being displayed on the display section under the control of the displaying control section. The display data production section may produce display data in accordance with which a mark for clearly indicating an end of the non-wired pattern searched out by the non-wired pattern searching section is to be additionally displayed at the end of the non-wired pattern.

With the wiring CAD apparatus, the designer can identify the interval from an end of a non-wired pattern to an object part pin for wiring at a moment on the display section without the necessity for searching a non-wired pattern by visual discernment after searching out of a non-wired pin as with a conventional wiring CAD apparatus. Consequently, the wiring CAD apparatus is advantageous in that improvement in operability and reduction in time for wiring designing can be achieved.

According to a still further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, and a display data production section for producing, in order to allow wiring design conditions of a plurality of layers to be displayed simultaneously in a hierarchically overlapping relationship on the display section, display data in accordance with which the wiring design conditions of the plurality of layers are to be displayed at positions displaced from each other, the display data produced by the display data production section being displayed on the display section under the control of the displaying control section. The wiring CAD apparatus may further comprise a hierarchic displaying order designation section for designating a hierarchic displaying order of the wiring design conditions of the plurality of layers, the display data production section producing display data in accordance with the hierarchic displaying order designated by the hierarchic displaying order designation section.

With the wiring CAD apparatus, the designer can visually confirm display data of a lower layer without deleting display data of an upper layer and can identify wiring patterns, via holes and so forth of a plurality of layers at a moment on the display section. Consequently, the wiring CAD apparatus is advantageous in that improvement in operability and reduction in time for wiring designing can be achieved.

According to a yet further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a position information calculation section operable upon wiring processing to newly add a wiring pattern to wiring design data displayed on the display section for calculating position information of a start point and an end point of the wiring pattern and position information of a pointer displayed on the display section to designate the position at which the wiring pattern is to be arranged, and a display data production section for producing, based on the position information of the start point and the end point of the wiring pattern and the position information of the pointer all calculated by the position information calculation section, display data of a rubber band by which an interval from the start point of the wiring pattern to the position of the pointer can be connected and another rubber band by which another interval from the position of the pointer to the end point of the wiring pattern can be connected, the display data produced by the display data production section being displayed on the display section under the control of the displaying control section.

With the wiring CAD apparatus, the designer can identify, by observing the display of a rubber band displayed in the interval from the position of the pointer to an end point of a wiring pattern upon wiring processing, the positional relationship between the pointer and the end point or the direction from the position of the pointer to the end point at a moment on the display section. Consequently, the wiring CAD apparatus is advantageous in that improvement in operability and reduction in time for wiring designing can be achieved while assuring optimum wiring.

According to a yet further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a processing object network searching section operable upon wiring processing to newly add a wiring pattern to wiring design data displayed on the display section or upon deletion processing to delete part of wiring design data displayed on the display section for searching a processing object network including a processing start point designated by a pointer displayed on the display section from among display data to the display section, and a display data production section for producing display data in accordance with which the processing object network searched out by the processing object network searching section is displayed on the display section in a visually distinguishable condition from any other network, the display data produced by the display data production section being displayed on the display section under the control of the displaying control section.

With the wiring CAD apparatus, since the designer can identify, upon wiring processing or deletion processing, a processing object network, whose processing end point is to be designated by the pointer, at a moment on the display section, the wiring CAD apparatus is advantageous in that improvement in operability and reduction in time for wiring designing can be achieved and also in that an error in wiring or an error in deletion can be prevented with certainty.

According to a yet further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a position information calculation section operable upon deletion processing to delete part of wiring design data displayed on the display section for calculating position information of a deletion start point designated by a pointer displayed on the display section and position information of the pointer and calculating a position which is nearest to the position of the pointer on a deletion object network including the deletion start point as deletion end point candidate position information, and a display data production section for producing, based on the position information of the deletion start point, the position information of the pointer and the deletion end point candidate position information all calculated by the position information calculation section, display data of a rubber band which is to be displayed to extend from the position of the deletion start point to the position of the pointer past the deletion end point candidate position, the display data produced by the display data production section being displayed on the display section under the control of the displaying control section.

With the wiring CAD apparatus, since the designer can identify, by observing the display of a rubber band upon deletion processing, a deletion end point candidate position on a deletion object network at a moment, the wiring CAD apparatus is advantageous in that improvement in operability and reduction in time for wiring designing can be achieved and besides an error in deletion can be prevented with certainty.

According to a yet further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a position information calculation section operable upon wiring processing to newly add a wiring pattern to wiring design data displayed on the display section for calculating position information of a wiring start point designated by a pointer displayed on the display section and position information of the pointer, a wiring determination section for successively determining, based on the position information of the wiring start point and the position information of the pointer both calculated by the position information calculation section, whether or not it is possible to wire a wiring line between the position of the wiring start point and the position of the pointer, an obstructing factor searching section operable when it is determined by the wiring determination section that it is impossible to wire a wiring line between the position of the wiring start point and the position of the pointer for searching the position of an obstructing factor at which the wiring is disabled, and a display data production section for producing, based on the position information of the wiring start point and the position information of the pointer both calculated by the position information calculation section, display data of a rubber band by which an interval from the wiring start point to the position of the pointer can be connected and for producing, when it is determined by the wiring determination section that it is impossible to wire a wiring line between the position of the wiring start point and the position of the pointer, display data in accordance with which a portion of the rubber band from the position of the obstructing factor searched out by the obstructing factor searching section to the position of the pointer is to be displayed on the display section in a visually distinguishable condition from the other portion of the rubber band from the position of the wiring start point to the position of the obstructing factor, the display data produced by the display data production section being displayed on the display section under the control of the displaying control section.

With the wiring CAD apparatus, by observing the display of a rubber band from a wiring start point to the pointer, the designer can identify an area from the position of the wiring start point in which wiring is possible, the possibility of wiring (whether or not wiring is possible) and/or the position of an obstructing factor when wiring is impossible, at a moment (on the real time basis) on the display section. Consequently, the wiring CAD apparatus is advantageous in that improvement in operability and reduction in time for wiring designing can be achieved.

According to a yet further aspect of the present invention, there is provided a wiring CAD apparatus, comprising a display section for displaying thereon a wiring design condition so as to allow wiring designing on a wiring design object to be performed interactively, a displaying control section for controlling the displaying condition of the display section, a position information calculation section operable upon wiring processing to newly add a wiring pattern to wiring design data displayed on the display section for calculating position information of a wiring start point and position information of a wiring end point both designated by a pointer displayed on the display section, a wiring determination section for determining, based on the position information of the wiring start point and the position information of the wiring end point both calculated by the position information calculation section, whether or not it is possible to wire a wiring line between the position of the wiring start point and the position of the wiring end point, an obstructing factor searching section for searching, when it is determined by the wiring determination section that it is impossible to wire a wiring line between the position of the wiring start point and the position of the wiring end point, the position of an obstructing factor by which the wiring is disabled, and a display data production section for producing display data in accordance with which the position of the obstructing factor searched out by the obstructing factor searching section is to be displayed clearly, the display data produced by the display data production section being displayed on the display section under the control of the displaying control section.

With the wiring CAD apparatus, when a wiring interval is designated with a wiring start point and a wiring end point, the designer can identify the possibility of wiring in the wiring interval and the position of an obstructing factor when the wiring is impossible at a moment on the display section. Consequently, the wiring CAD apparatus is advantageous in that improvement in operability and reduction in time for wiring designing can be achieved.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENT a. Aspects of the Invention

Figure 1:
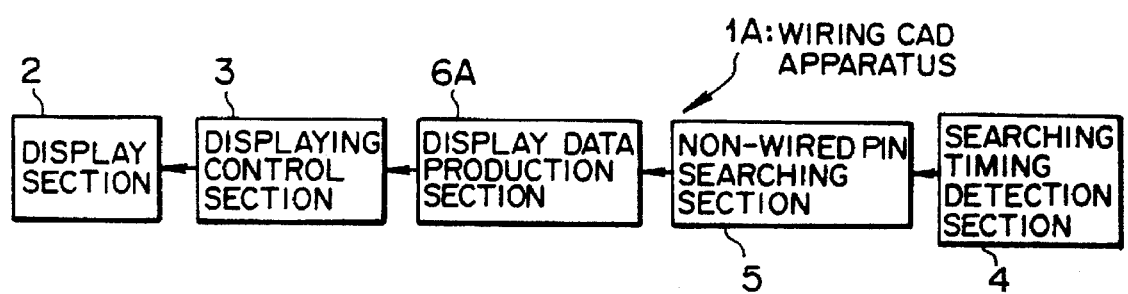
FIGS. 1 to 9 are block diagrams illustrating different aspects of the present invention.

Referring first to FIG. 1, there is shown in block diagram a wiring CAD apparatus according to an aspect of the present invention. The wiring CAD apparatus is generally denoted at 1A and includes a display section 2 for displaying thereon a wiring design condition so as to allow wiring designing on a wiring design object to be performed interactively, and a displaying control section 3 for controlling the displaying condition of the display section 2. The wiring CAD apparatus 1A further includes a searching timing detection section 4, a non-wired pin searching section 5 and a display data production section 6A described below.

The searching timing detection section 4 detects a new displaying processing timing at which new wiring design data is to be displayed on the display section 2 or a deletion processing timing at which part of wiring design data displayed on the display section 2 is to be deleted as a searching timing for a non-wired pin which is a part pin which is not wired on a wiring design object.

The non-wired pin searching section 5 operates in response to a searching timing detected by the searching timing detection section 4 to search a non-wired pin on a wiring design object from among display data to the display section 2.

The display data production section 6A produces display data in accordance with which a non-wired pin searched out by the non-wired pin searching section 5 is to be displayed on the display section 2 in a visually distinguishable condition from another already wired part pin. Display data produced by the display data production section 6A is displayed on the display section 2 under the control of the displaying control section 3.

In the wiring CAD apparatus 1A, if a new displaying processing timing or a deletion processing timing is detected by the searching timing detection section 4, then a non-wired pin which is not wired on a wiring design object is automatically searched by the non-wired pin searching section 5 in response to the thus detected timing.

Then, the display data production section 6A produces display data in accordance with which the non-wired pin is to be displayed on the display section 2 in a visually distinguishable condition from another already wired part pin, and the display data thus produced is displayed on the display section 2 under the control of the displaying control section 3.

Accordingly, since the designer can normally identify a non-wired pin at a moment on the display section 2 without inputting an instruction every time to display a non-wired pin as different from a conventional wiring CAD apparatus, the wiring CAD apparatus 1A is advantageous in that improvement in operability and reduction in time for wiring designing can be achieved and such a situation that wiring designing is completed while a non-wired pin remains can be prevented with certainty.

Figure 2:
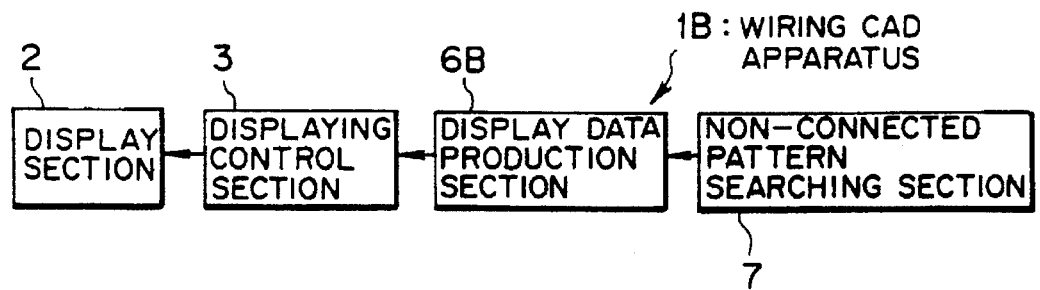

Referring now to FIG. 2, there is shown in block diagram a wiring CAD apparatus according to another aspect of the present invention. The wiring CAD apparatus is generally denoted at 1B and includes, in addition to such a display section 2 and a displaying control section 3 as described above, a non-connected pattern searching section 7 and a display data production section 6B described below.

The non-connected pattern searching section 7 searches, from among display data to the display section 2, a non-connected pattern which is a wiring pattern connected to no element on a wiring design object.

The display data production section 6B produces display data in accordance with which a non-connected pattern searched out by the non-connected pattern searching section 7 is to be displayed on the display section 2 in a visually distinguishable condition from any other wiring pattern, and the display data thus produced is displayed on the display section 2 under the control of the displaying control section 3. In this instance, the display data production section 6B may produce display data in accordance with which a mark for clearly indicating an end of a non-connected pattern searched out by the non-connected pattern searching section 7 is to be additionally displayed on the display section 2 at each of the opposite ends of the non-connected pattern.

In the wiring CAD apparatus 1B described above, a non-connected pattern is automatically searched by the non-connected pattern searching section 7, and display data in accordance with which the non-connected pattern searched out by the non-connected pattern searching section 7 is to be displayed on the display section 2 in a visually distinguishable condition from any other wiring pattern is produced by the display data production section 6B. The display data thus produced is displayed on the display section 2 under the control of the displaying control section 3.

Accordingly, the designer can identify the non-connected pattern at a moment on the display section 2 without repeating searching by visual discernment as different from a conventional wiring CAD apparatus.

In this instance, where the display data production section 6B produces display data in accordance with which a mark for clearly indicating an end of a non-connected pattern is to be additionally displayed at each of the opposite ends of the non-connected pattern, the designer can confirm the opposite ends of the non-connected pattern at a moment on the display section 2.

Consequently, the wiring CAD apparatus 1B is advantageous in that improvement in operability and reduction in time for wiring designing can be achieved and such a situation that wiring designing is completed before processing of deleting a wiring pattern or the like is performed can be prevented with certainty.

Figure 3:
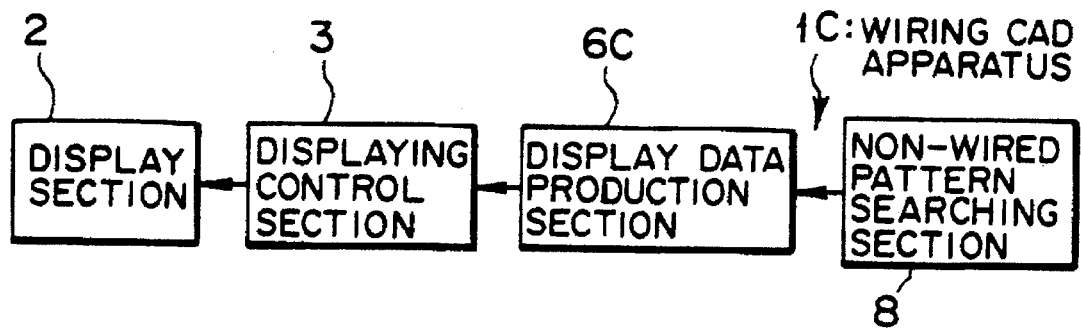

Referring now to FIG. 3, there is shown in block diagram a wiring CAD apparatus according to a further aspect of the present invention. The wiring CAD apparatus is generally denoted at 1C and includes, in addition to such a display section 2 and a displaying control section 3 as described above, a non-wired pattern searching section 8 and a display data production section 6C described below.

The non-wired pattern searching section 8 searches, from among display data to the display section 2, a non-wired pattern which is a wiring pattern which forms a non-wired interval on a wiring design object.

The display data production section 6C produces display data in accordance with which a line interconnecting an end of a non-wired pattern searched out by the non-wired pattern searching section 8 and a part pin to which the non-wired pattern is to be connected is to be displayed on the display section 2, and the display data thus produced by the display data production section 6C is displayed on the display section 2 under the control of the displaying control section 3. In this instance, the display data production section 6C may produce display data in accordance with which a mark for clearly indicating an end of a non-wired pattern searched out by the non-wired pattern searching section 8 is to be additionally displayed at the end of the non-wired pattern.

In the wiring CAD apparatus 1C described above, a non-wired pattern is automatically searched by the non-wired pattern searching section 8, and display data in accordance with which a line interconnecting an end of the non-wired pattern and a part pin to which the non-wired pattern is to be connected is to be displayed on the display section 2 is produced by the display data production section 6C. The display data thus produced is displayed on the display section 2 under the control of the displaying control section 3.

Accordingly, the designer can identify the interval from the end of the non-wired pattern to the object part pin for wiring at a moment on the display section 2 without searching a non-wired pattern by visual discernment after searching out of a non-wired pin, as different from a conventional wiring CAD apparatus.

In this instance, where the display data production section 6C produces display data in accordance with which a mark for clearly indicating an end of a non-wired pattern is to be additionally displayed at the end of the non-wired pattern and the display data thus produced is displayed on the display section 2, the designer can confirm the end of the non-wired pattern at a moment on the display section 2.

Consequently, the wiring CAD apparatus 1C is advantageous in that improvement in operability and reduction in time for wiring designing can be achieved.

Figure 4:
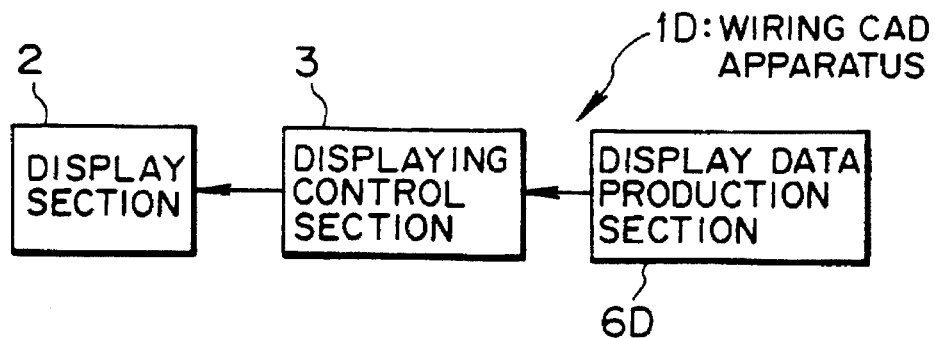

Referring now to FIG. 4, there is shown in block diagram a wiring CAD apparatus according to a still further aspect of the present invention. The wiring CAD apparatus is generally denoted at 1D and includes, in addition to such a display section 2 and a displaying control section 3 as described above, a display data production section 6D described below.

The display data production section 6D produces, in order to allow wiring design conditions of a plurality of layers to be displayed simultaneously in a hierarchically overlapping relationship on the display section 2, display data in accordance with which the wiring design conditions of the plurality of layers are to be displayed at positions displaced from each other, and the display data produced by the display data production section 6D is displayed on the display section 2 under the control of the displaying control section 3. In this instance, the wiring CAD apparatus may be constructed such that it further comprises a hierarchic displaying order designation section for designating a hierarchic displaying order of the wiring design conditions of the plurality of layers, and the display data production section 6D produces display data in accordance with the hierarchic displaying order designated by the hierarchic displaying order designation section.

In the wiring CAD apparatus 1D described above, in order to allow wiring design conditions of a plurality of layers to be displayed simultaneously in a hierarchically overlapping relationship on the display section 2, display data in accordance with which the wiring design conditions of the plurality of layers are to be displayed at positions displaced from each other are produced by the display data production section 6D, and the display data thus produced are displayed on the display section 2 under the control of the displaying control section 3.

Accordingly, the designer can visually confirm display data of a lower layer, which is overlapped with an upper layer and cannot be visually discerned because of the presence of the upper layer, without deleting display data of the upper layer and can identify wiring patterns, via holes and so forth of a plurality of layers at a moment on the display section 2. Consequently, the wiring CAD apparatus 1D is advantageous in that improvement in operability and reduction in time for wiring designing can be achieved.

In this instance, where the display data production section 6D produces display data in accordance with a hierarchic displaying order designated by the hierarchic displaying order designation section, the designer can cause the display section 2 to display an arbitrary layer as an uppermost layer and can thus identify the wiring condition of any layer at a moment on the display section 2. Consequently, the wiring CAD apparatus 1D is further advantageous in that it further contributes to improvement in operability and reduction in time for wiring designing.

Figure 5:
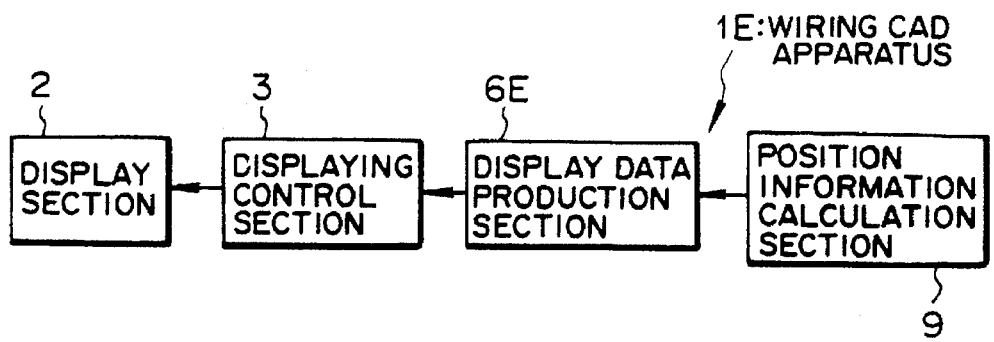

Referring now to FIG. 5, there is shown in block diagram a wiring CAD apparatus according to a yet further aspect of the present invention; The wiring CAD apparatus is generally denoted at 1E and includes, in addition to such a display section 2 and a displaying control section 3 as described above, a position information calculation section 9 and a display data production section 6E described below.

The position information calculation section 9 operates, upon wiring processing to newly add a wiring pattern to wiring design data displayed on the display section 2, to calculate position information of a start point and an end point of the wiring pattern and position information of a pointer displayed on the display section 2 to designate the position at which the wiring pattern is to be arranged.

The display data production section 6E produces, based on position information of a start point and an end point of a wiring pattern and position information of the pointer all calculated by the position information calculation section 9, display data of a rubber band by which an interval from the start point of the wiring pattern to the position of the pointer can be connected and another rubber band by which another interval from the position of the pointer to the end point of the wiring pattern can be connected. Display data produced by the display data production section 6E are displayed on the display section 2 under the control of the displaying control section 3.

In the wiring CAD apparatus 1E described above, upon wiring processing, position information of a start point and an end point of the wiring pattern and position information of the pointer displayed on the display section 2 to designate the position at which the wiring pattern is to be arranged are calculated by the position information calculation section 9.

Based on the position information of the start point and the end point of the wiring pattern and the position information of the pointer thus calculated, display data of a rubber band by which an interval from the start point of the wiring pattern to the position of the pointer can be connected and another rubber band by which another interval from the position of the pointer to the end point of the wiring pattern can be connected are produced by the display data production section 6E. The display data thus produced are displayed on the display section 2 under the control of the displaying control section 3.

Accordingly, the designer can identify, by observing the display of the rubber band displayed in the interval from the position of the pointer to the end point of the wiring pattern, the positional relationship between the pointer and the end point or the direction from the position of the pointer to the end point at a moment on the display section 2. Consequently, the wiring CAD apparatus 1E is advantageous in that improvement in operability and reduction in time for wiring designing can be achieved while assuring optimum wiring.

Figure 6:
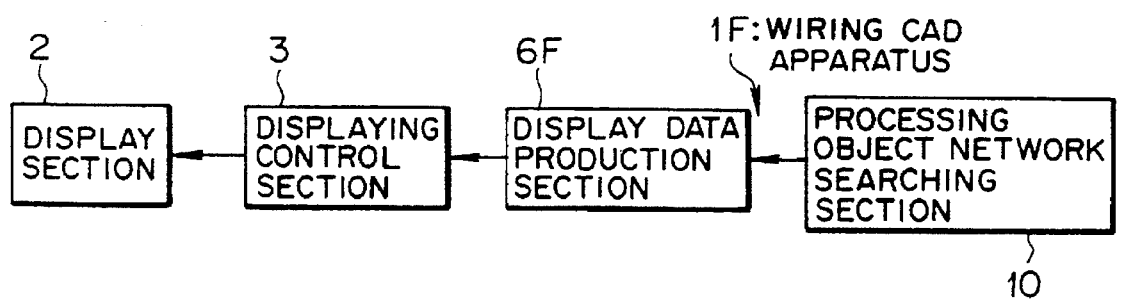

Referring now to FIG. 6, there is shown in block diagram a wiring CAD apparatus according to a yet further aspect of the present invention. The wiring CAD apparatus is generally denoted at 1F and includes, in addition to such a display section 2 and a displaying control section 3 as described above, a processing object network searching section 10 and a display data production section 6F described below.

The processing object network searching section 10 operates, upon wiring processing to newly add a wiring pattern to wiring design data displayed on the display section 2 or upon deletion processing to delete part of wiring design data displayed on the display section 2, to search a processing object network including a processing start point designated by a pointer displayed on the display section 2 from among display data to the display section 2.

The display data production section 6F produces display data in accordance with which a processing object network searched out by the processing object network searching section 10 is displayed on the display section 2 in a visually distinguishable condition from any other network. Display data produced by the display data production section 6F is displayed on the display section 2 under the control of the displaying control section 3.

In the wiring CAD apparatus 1F described above, upon wiring processing or upon deletion processing, a processing object network including a processing start point designated by the pointer displayed on the display section is automatically searched by the processing object network searching section 10.

Then, display data in accordance with which the processing object network is to be displayed on the display section 2 in a visually distinguishable condition from any other network is produced by the display data production section 6F. The display data thus produced is displayed on the display section 2 under the control of the displaying control section 3.

Accordingly, since the designer can identify a processing object network, whose processing end point is to be designated by the pointer, at a moment on the display section 2, the wiring CAD apparatus 1F is advantageous in that improvement in operability and reduction in time for wiring designing can be achieved and also in that an error in wiring or an error in deletion can be prevented with certainty.

Figure 7:
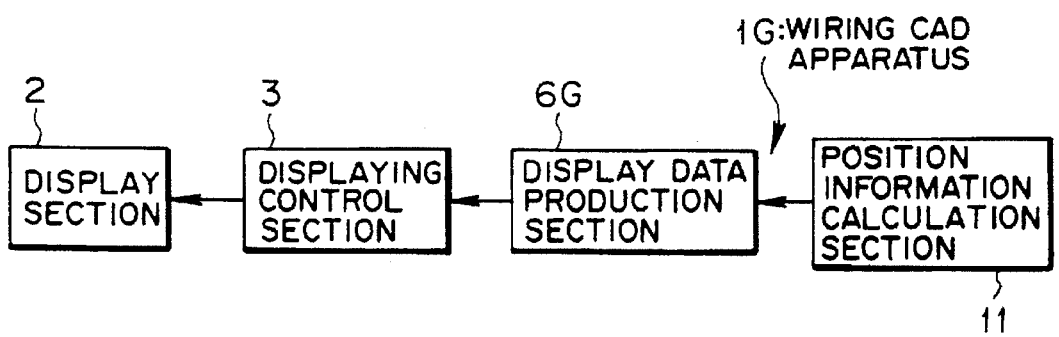

Referring now to FIG. 7, there is shown in block diagram a wiring CAD apparatus according to a yet further aspect of the present invention. The wiring CAD apparatus is generally denoted at 1G and includes, in addition to such a display section 2 and a displaying control section 3 as described above, a position information calculation section 11 and a display data production section 6G described below.

The position information calculation section 11 operates, upon deletion processing to delete part of wiring design data displayed on the display section 2, to calculate position information of a deletion start point designated by a pointer displayed on the display section 2 and position information of the pointer and calculate a position which is nearest to the position of the pointer on a deletion object network including the deletion start point as deletion end point candidate position information.

The display data production section 6G produces, based on position information of a deletion start point, position information of the pointer and deletion end point candidate position information all calculated by the position information calculation section 11, display data of a rubber band which is to be displayed to extend from the position of the deletion start point to the position of the pointer past the deletion end point candidate position. Display data produced by the display data production section 6G is displayed on the display section 2 under the control of the displaying control section 3.

In the wiring CAD apparatus 1G described above, upon deletion processing, position information of a deletion start point designated by the pointer and position information of the pointer are calculated by the position information calculation section 11. Further, a position which is nearest to the position of the pointer on a deletion object network including the deletion start point is calculated as deletion end point candidate position information by the position information calculation section 11.

Then, based on the position information of the deletion start point, the position information of the pointer and the deletion end point candidate position information, display data of a rubber band which is to be displayed to extend from the position of the deletion start point to the position of the pointer past the deletion end point candidate position is formed by the display data production section 6G. The display data is displayed on the display section 2 under the control of the displaying control section 3.

Accordingly, since the designer can identify, by observing the display of the rubber band, the deletion end point candidate position on the deletion object network at a moment, the wiring CAD apparatus 1G is advantageous in that improvement in operability and reduction in time for wiring designing can be achieved and besides an error in deletion can be prevented with certainty.

Figure 8:
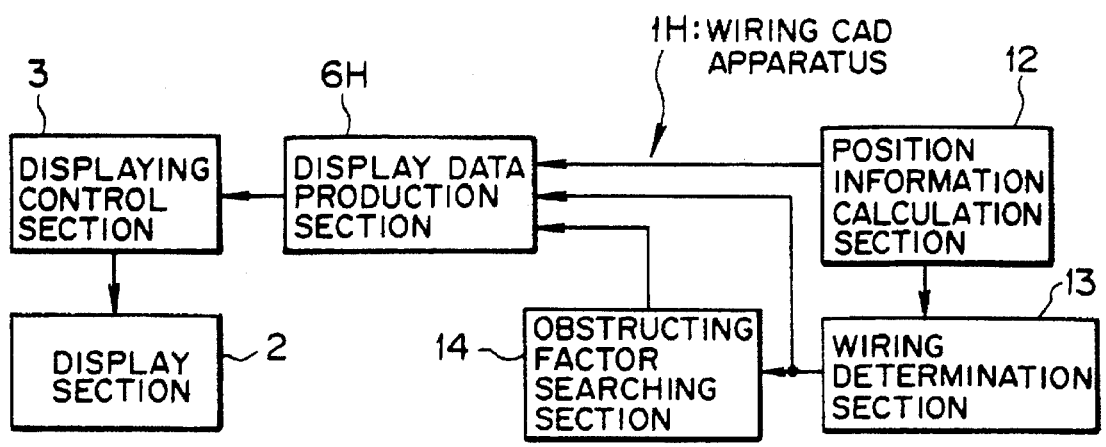

Referring now to FIG. 8, there is shown in block diagram a wiring CAD apparatus according to a yet further aspect of the present invention. The wiring CAD apparatus is generally denoted at 1H and includes, in addition to such a display section 2 and a displaying control section 3 as described above, a position information calculation section 12, a wiring determination section 13, an obstructing factor searching section 14 and a display data production section 6H described below.

The position information calculation section 12 operates, upon wiring processing to newly add a wiring pattern to wiring design data displayed on the display section 2, to calculate position information of a wiring start point designated by a pointer displayed on the display section 2 and position information of the pointer.

The wiring determination section 13 successively determines, based on position information of a wiring start point and position information of the pointer both calculated by the position information calculation section 12, whether or not it is possible to wire a wiring line between the position of the wiring start point and the position of the pointer. The obstructing factor searching section 14 operates, when it is determined by the wiring determination section 13 that it is impossible to wire a wiring line between the position of a wiring start point and the position of the pointer, to search the position of an obstructing factor at which the wiring is disabled.

The display data production section 6H produces, based on position information of a wiring start point and position information of the pointer both calculated by the position information calculation section 12, display data of a rubber band by which an interval from the wiring start point to the position of the pointer can be connected. Also, the display data production section 6H produces, when it is determined by the wiring determination section 13 that it is impossible to wire a wiring line between the position of the wiring start point and the position of the pointer, display data in accordance with which a portion of the rubber band from the position of the obstructing factor searched out by the obstructing factor searching section 14 to the position of the pointer is to be displayed on the display section 2 in a visually distinguishable condition from the other portion of the rubber band from the position of the wiring start point to the position of the obstructing factor. Display data produced by the display data production section 6H are displayed on the display section 2 under the control of the displaying control section 3.

In the wiring CAD apparatus 1H described above, upon wiring processing, position information of a wiring start point designated by the pointer and position information of the pointer are calculated by the position information calculation section 12, and based on the position information of the wiring start point and the position information of the pointer thus calculated, it is successively determined by the wiring determination section 13 whether or not it is possible to wire a wiring line between the position of the wiring start point and the position of the pointer.

Then, when it is determined by the wiring determination section 13 that such wiring is impossible, the position of an obstructing factor at which the wiring is disabled is searched by the obstructing factor searching section 14. Then, display data in accordance with which a portion of a rubber band from the position of the obstructing factor to the position of the pointer is to be displayed on the display section 2 in a visually distinguishable condition from the other portion of the rubber band from the position of the wiring start point to the position of the obstructing factor are produced by the display data production section 6H. The display data thus produced are displayed on the display section 2 under the control of the displaying control section 3.

Accordingly, by observing the display of the rubber band from the wiring start point to the pointer, the designer can identify an area from the position of the wiring start point in which wiring is possible, the possibility of wiring (whether or not wiring is possible) and/or the position of an obstructing factor when wiring is impossible, at a moment (on the real time basis) on the display section 2. Consequently, the wiring CAD apparatus 1H is advantageous in that improvement in operability and reduction in time for wiring designing can be achieved.

Figure 9:
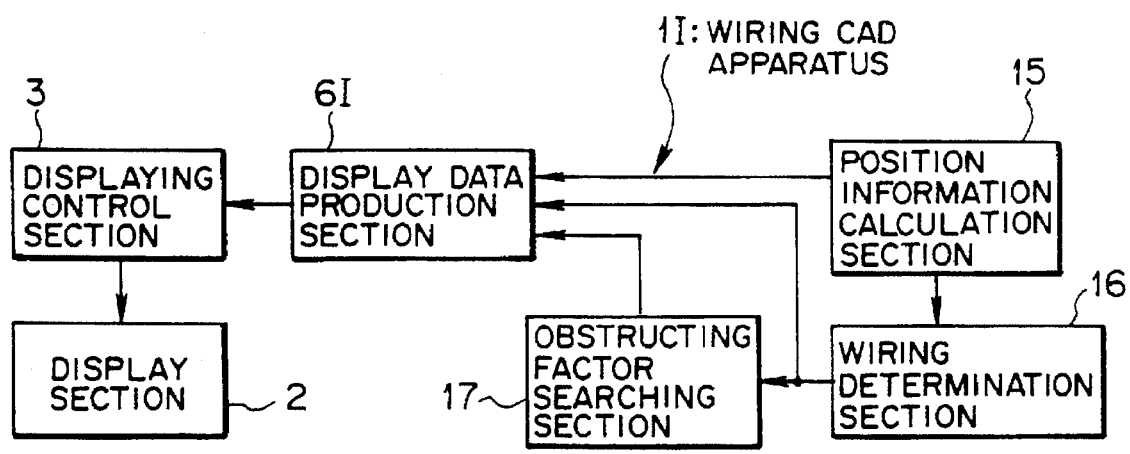

Referring now to FIG. 9, there is shown in block diagram a wiring CAD apparatus according to a yet further aspect of the present invention. The wiring CAD apparatus is generally denoted at 1I and includes, in addition to such a display section 2 and a displaying control section 3 as described above, a position information calculation section 15, a wiring determination section 16, an obstructing factor searching section 17 and a display data production section 6I described below.

The position information calculation section 15 operates, upon wiring processing to newly add a wiring pattern to wiring design data displayed on the display section 2, to calculate position information of a wiring start point and position information of a wiring end point both designated by a pointer displayed on the display section 2.

The wiring determination section 16 determines, based on position information of a wiring start point and position information of a wiring end point both calculated by the position information calculation section 15, whether or not it is possible to wire a wiring line between the position of the wiring start point and the position of the wiring end point. The obstructing factor searching section 17 searches, when it is determined by the wiring determination section 16 that it is impossible to wire a wiring line between the position of a wiring start point and the position of a wiring end point, the position of an obstructing factor by which the wiring is disabled.

The display data production section 6I produces display data in accordance with which the position of an obstructing factor searched out by the obstructing factor searching section 17 is to be displayed clearly. Display data produced by the display data production section 6I is displayed on the display section 2 under the control of the displaying control section 3.

In the wiring CAD apparatus 1I described above, upon wiring processing, position information of a wiring start point and position information of a wiring end point both designated by the pointer are calculated by the position information calculation section 15, and based on the position information of the wiring start point and the position information of the wiring end point thus calculated, it is determined by the wiring determination section 16 whether or not it is possible to wire a wiring line between the position of the wiring start point and the position of the wiring end point.

If it is determined by the wiring determination section 16 that such wiring is impossible, the position of an obstructing factor by which the wiring is disabled is searched by the obstructing factor searching section 17, and display data in accordance with which the position of the obstructing factor is to be displayed clearly is produced by the display data production section 6I. The display data thus produced is displayed on the display section 2 under the control of the displaying control section 3.

Accordingly, when a wiring interval is designated with a wiring start point and a wiring end point, the designer can identify the possibility of wiring in the wiring interval and the position of an obstructing factor when the wiring is impossible at a time on the display section 2. Consequently, the wiring CAD apparatus 1I is advantageous in that improvement in operability and reduction in time for wiring designing can be achieved.

b. Description of a Preferred Embodiment

Figure 10:
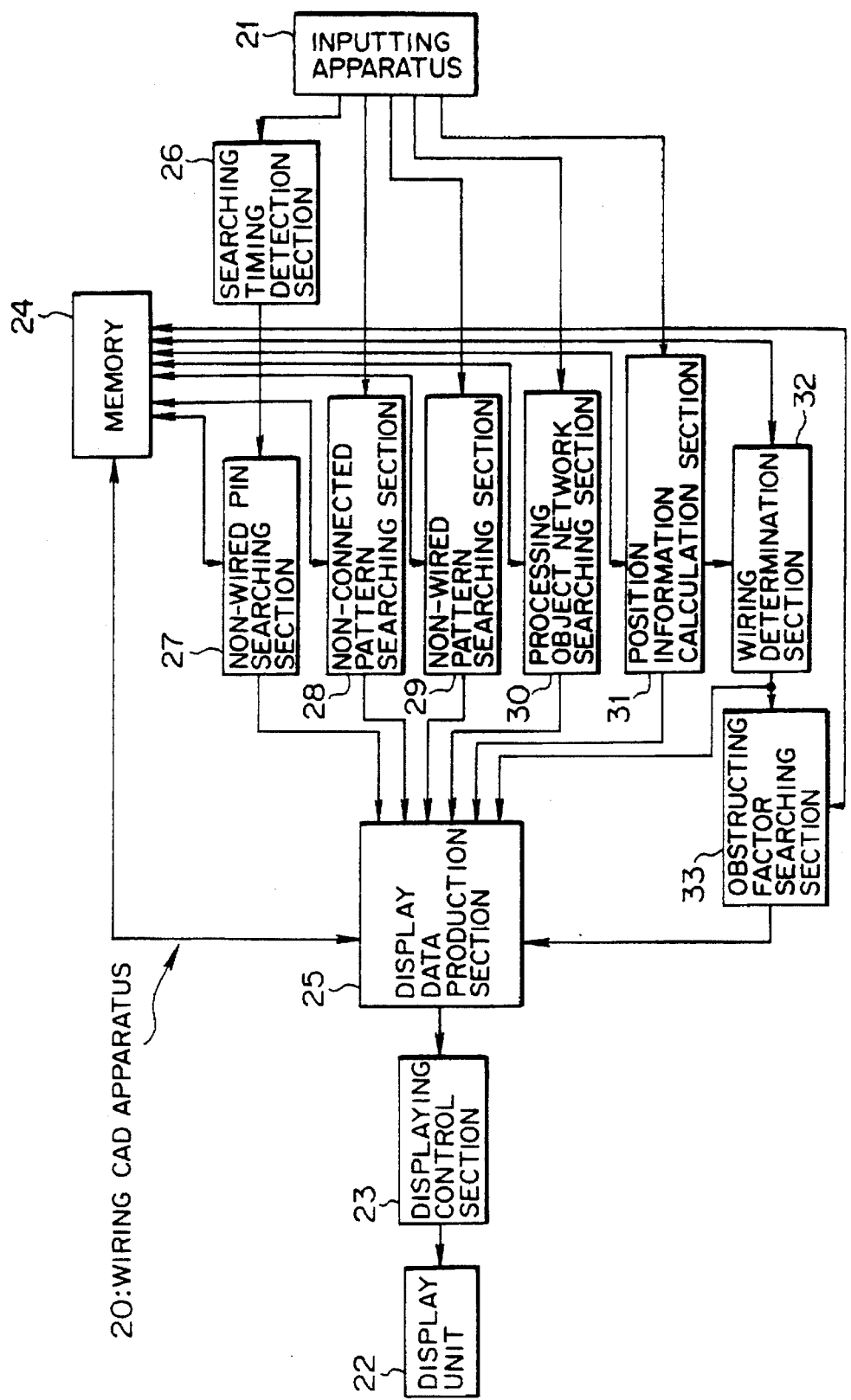
FIG. 10 is a block diagram showing the construction of a wiring CAD apparatus according to a preferred embodiment of the present invention.

Referring now to FIG. 10, there is shown in block diagram the construction of a wiring CAD apparatus according to a preferred embodiment of the present invention. The wiring CAD apparatus shown is generally denoted at 20 and includes, in order to perform wiring designing on a wiring design object such as, for example, an LSI, an MCM or a PWB interactively, an inputting apparatus 21 such as, for example, a keyboard, a mouse or a tablet for being operated by a designer to input various data, various instructions and so forth therethrough, a display unit (display section) 22 such as a CRT (cathode ray tube) for displaying a wiring design condition, and a displaying control section 23 for controlling the displaying condition of the display unit 22.

The wiring CAD apparatus 20 further includes a memory 24, a display data production section 25, a searching timing detection section 26, a non-wired pin searching section 27, a non-connected pattern searching section 28, a non-wired pattern searching section 29, a processing object network searching section 30, a position information calculation section 31, a wiring determination section 32 and an obstructing factor searching section 33 which will be described below. The memory 24 is constituted, for example, from a RAM, a ROM or the like, and functions of the components denoted by reference numerals 25 to 33 are realized, for example, by a CPU (central processing unit).

The memory 24 stores all display data on a wiring design object to be displayed on the display unit 22. The display data production section 25 has such various functions as hereinafter described and produces data (display data) to be displayed on the display unit 22.

The searching timing detection section 26 detects a new displaying processing timing at which new wiring design data are to be displayed on the display unit 22 or a deletion processing timing at which wiring design data displayed on the display unit 22 are to be partially deleted, or in other words, a processing timing at which a non-wired pin may possibly appear. When such timing is detected, the non-wired pin searching section 27 described below is activated.

The non-wired pin searching section 27 is activated when a searching timing is detected by the searching timing detection section 26, and searches a non-wired pin on a wiring design object from among all display data to the display unit 22 stored in the memory 24 and outputs a result of the searching to the display data production section 25.

The non-connected pattern searching section 28 is activated when an instruction to display a non-connected pattern (to set a non-connected pattern displaying mode) is inputted by way of the inputting apparatus 21, and searches a non-connected pattern on a wiring design object from among all display data to the display unit 22 stored in the memory 24 and outputs a result of the searching to the display data production section 25.

Similarly, the non-wired pattern searching section 29 is activated when an instruction to display a non-wired pattern (to set a non-wired pattern displaying mode) is inputted by way of the inputting apparatus 21, and searches a non-wired pattern on a wiring design object from among all display data to the display unit 22 stored in the memory 24 and outputs a result of the searching to the display data production section 25.

The processing object network searching section 30 searches a processing object network including a processing start point designated by a mouse pointer (or a cursor) from among all displayed data to the display unit 22 stored in the memory 24 when wiring processing to newly add a wiring pattern to wiring design data displayed on the display unit 22 is to be performed or when deleting processing to delete part of wiring design data displayed on the display unit 22 is to be performed, and outputs a result of the searching to the display data production section 25.

The position information calculation section 31 calculates, upon wiring processing, position information of the mouse pointer and position information of a wiring start point and a wiring end point designated by the mouse pointer as coordinates on the screen of the display unit 22.

Further, when an instruction to display the position of a deletion end point candidate on the real time basis (to set a real time displaying mode for a deletion end point candidate position) is inputted by way of the inputting apparatus 21, the position information calculation section 31 in the present embodiment calculates position information of the mouse pointer and position information of a deletion start point designated by the mouse pointer and calculates a position nearest to the position of the mouse pointer on a deletion object network including the deletion start point as deletion end point candidate position information.

The wiring determination section 32 is activated when an instruction to display the possibility of wiring, that is, whether or not wiring is possible, on the real time basis (to set a wiring possibility real time displaying mode) is inputted by way of the inputting apparatus 21, and normally determines, based on position information of a wiring start point and position information of the mouse pointer both calculated by the position information calculation section 31, whether or not it is possible to wire a wiring line between the position of the wiring start point and the position of the mouse pointer.

The wiring determination section 32 is activated also when an instruction to display an obstacle (to set an obstacle displaying mode) is inputted by way of the inputting apparatus 21, and if a wiring start point and a wiring end point are designated, that is, if a wiring interval is designated, then the wiring determination section 32 determines, based on the position information of the wiring start point and the position information of the wiring end point both calculated by the position information calculation section 31, whether or not it is possible to wire a wiring line between the position of the wiring start point and the position of the wiring end position.

The obstructing factor searching section 33 searches, when it is determined by the wiring determination section 32 that it is impossible to wire a wiring line between the position of a wiring start point and the position of the mouse pointer or the position of a wiring end point, the position of an obstructing factor (obstacle), by which such wiring is rendered impossible, based on all display data to the display unit 22 stored in the memory 24, and outputs a result of the searching to the display data production section 25.

Figure 15:
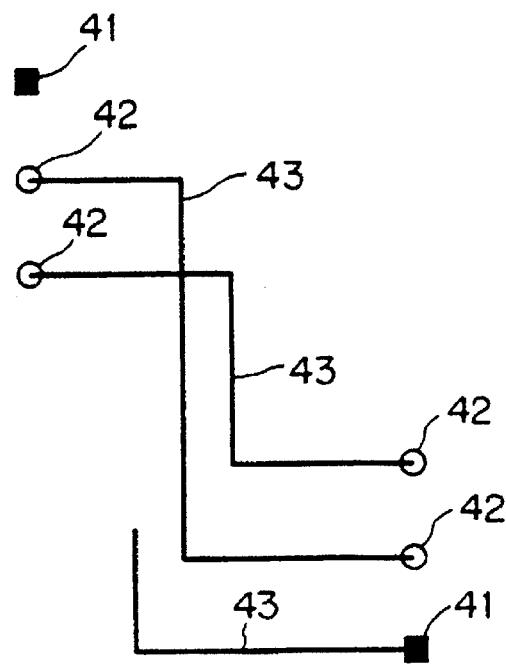
FIG. 15 is a diagrammatic view showing an example of a display of a non-wired pin by the wiring CAD apparatus shown in FIG. 10.

The display data production section 25 in the present embodiment has functions of producing such display data as described in items 1) to 10) below:

1) The display data production section 25 produces display data in accordance with which a non-wired pin searched out by the non-wired pin searching section 27 is to be displayed on the display unit 22 in a visually distinguishable condition from a part pin for which wiring has been completed. Based on such display data, on the screen of the display unit 22, for example, each non-wired pin 41 is displayed as "■" and each already wired pin 42 is displayed as "○" as seen in FIG. 15. It is to be noted that reference numeral 43 in FIG. 15 denotes a wiring pattern. While, in the example shown in FIG. 15, the non-wired pins 41 and the already wired pins 42 are displayed in different display shapes from each other so that they can be distinguished from each other, some other display shapes may be employed or different display colors may be employed alternatively to allow distinction between them.

Figure 16:
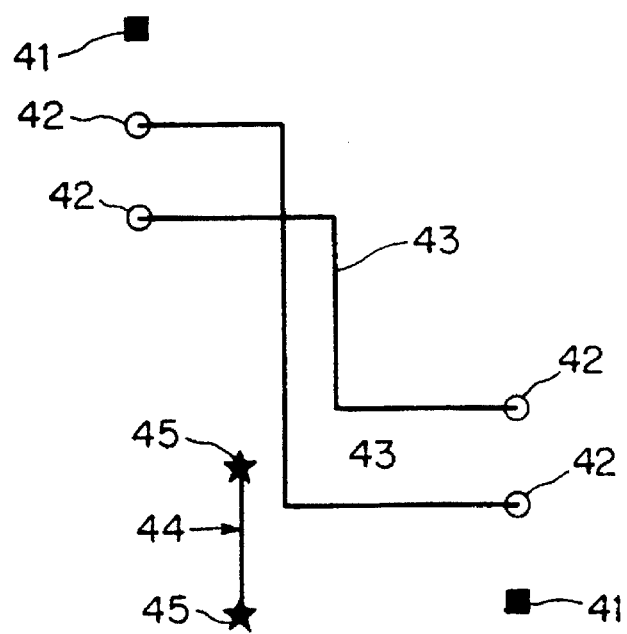
FIG. 16 is a similar view but showing an example of a display of a non-connected pattern by the wiring CAD apparatus shown in FIG. 10.

2) The display data production section 25 produces display data in accordance with which a non-connected pattern searched out by the non-connected pattern searching section 28 is to be displayed on the display unit 22 in a visually distinguishable condition from another wiring pattern. In this instance, display data in accordance with which marks for clearly indicating the opposite ends of a non-connected pattern searched out by the non-connected pattern searching section 28 are to be additionally indicated at the opposite ends of the non-connected pattern are produced. Based on such display data, on the screen of the display unit 22, each of the opposite ends 45 of each non-connected pattern 44 is displayed, for example, together with "★" added thereto as shown in FIG. 16. In this instance, such non-connected pattern 44 may alternatively be displayed differently in a different display color or in a different displaying shape from that of the other wiring patterns 43.

Figure 17:
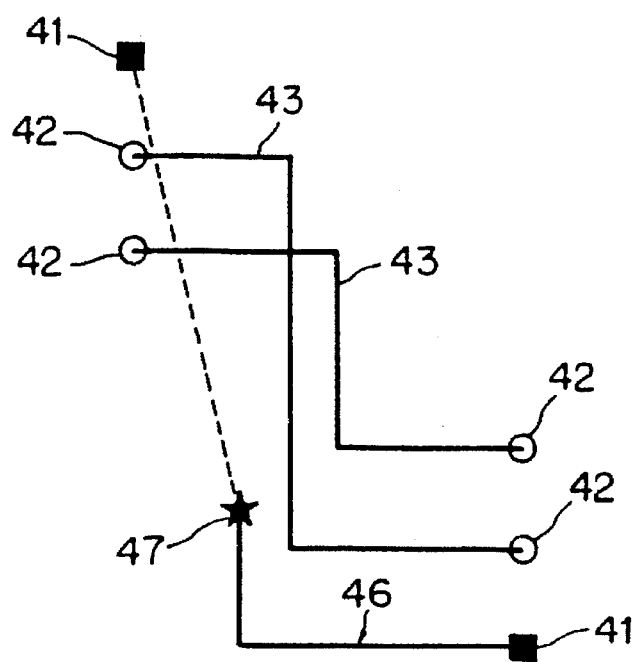
FIG. 17 is a similar view but showing an example of a display of a non-wired pattern by the wiring CAD apparatus shown in FIG. 10.

3) The display data production section 25 produces display data in accordance with which a line which interconnects an end of a non-wired pattern searched out by the non-wired pattern searching section 29 and a part pin to which the non-wired pattern is to be connected is to be displayed. In this instance, display data in accordance with which a mark for clearly showing the end of the non-wired pattern searched out by the non-wired pattern searching section 29 is to be additionally displayed is produced. Based on such display data, on the screen of the display unit 22, an end 47 of a non-wired pattern 46 is displayed, for example, together with "★" added thereto and a line 48 extending from the end 47 of the non-wired pattern 46 to the non-wired pin 41 to which the non-wired pattern 46 is to be connected is displayed as shown in FIG. 17. The line 48 may be such a straight line as shown in FIG. 17 or may alternatively be a curved line such as an arc.

Figure 18:
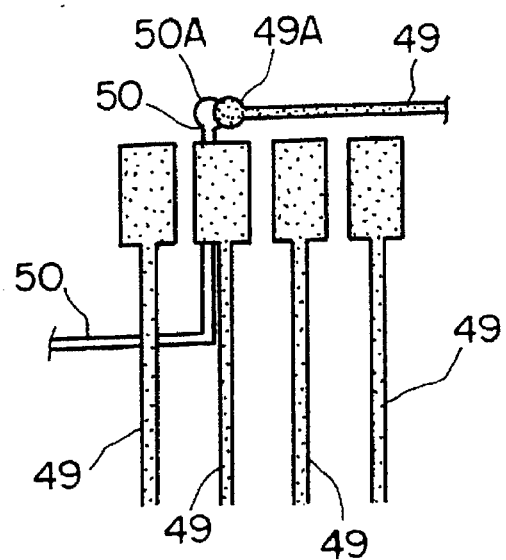
FIG. 18 is a diagrammatic view showing an example of a hierarchic display of wiring patterns by the wiring CAD apparatus shown in FIG. 10.

4) The display data production section 25 produces display data in accordance with which, in order to display wiring design conditions (such as wiring patterns, via holes, IV][s and so forth) of a plurality of layers simultaneously in a hierarchically overlapping relationship on the display unit 22, the displaying positions of the wiring design conditions of the different layers are displaced or offset from each other and different displaying colors (or different displaying shapes) are used for the different layers. Based on such display data, on the screen of the display unit 22, for example, as shown in FIG. 18, wiring patterns 49 of the first layer (L1) are displayed in blue (screened displaying portion in FIG. 18) while another wiring pattern 50 in the second layer (L2) is displayed, for example, in red (blank in FIG. 18) and in a displaced or offset condition by a suitable distance from the wiring patterns 49 of the first layer. Also a via hole (or IVH) 49A of the first layer and another via hole (or IVH) 50A of the second layer are displayed in a displaced condition by the suitable distance from each other as seen from FIG. 19. It is to be noted that the displaying manner in which the displaying positions of wiring patterns are displaced from each other as described above is used when a displaying position varying instruction is inputted by way of the inputting apparatus 21.

Figure 20:
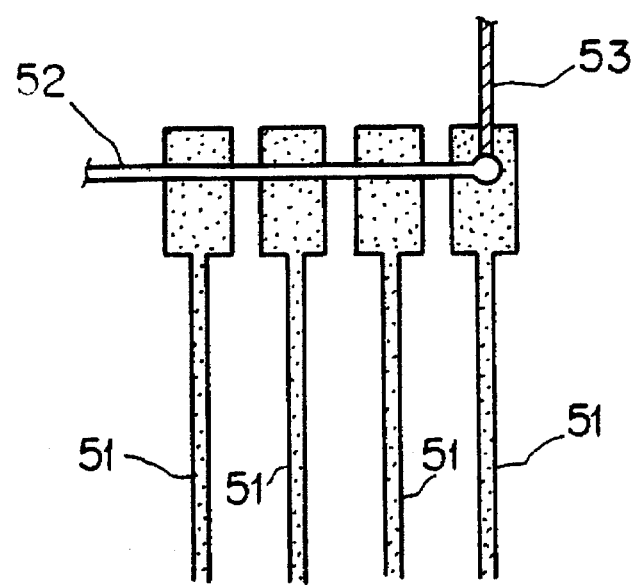
FIG. 20 is a diagrammatic view illustrating an example of a variation in displaying order in a hierarchic displaying condition by the wiring CAD apparatus shown in FIG. 10.

5) The display data production section 25 produces display data in accordance with a designated hierarchic displaying order of wiring design conditions of different layers when the hierarchic displaying order is designated by way of the inputting apparatus (hierarchic displaying order designation section) 21. Based on the display data, on the screen of the display unit 22, different from the ordinary displaying condition wherein the first layer is displayed preferentially and the second layer, the third layer, . . . are displayed in this order below the first layer, wiring patterns 51 to 53 of the first to third layers are displayed in a designated order (in the order of the second layer, the third layer and the first layer), for example, as shown in FIG. 20. In FIG. 20, the wiring patterns 51 of the first layer (L1) are displayed, for example, in blue (screened displaying portion in FIG. 20); the wiring pattern 52 of the second layer (L2) is displayed, for example, in red (blank in FIG. 20); and the wiring pattern 53 of the third layer (L3) is displayed, for example, in yellow (indicated by slanting lines in FIG. 20).

Figure 21:
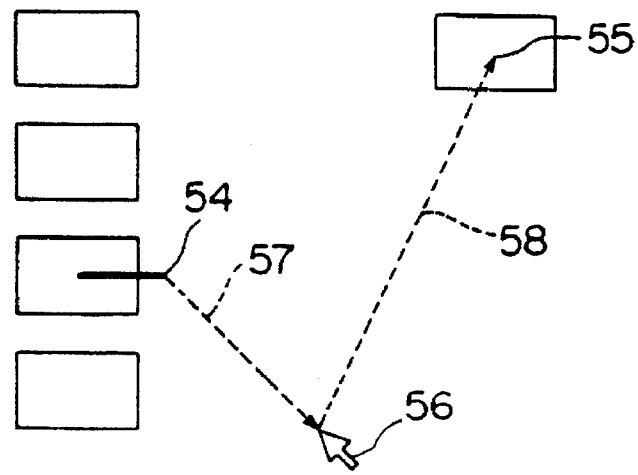
FIG. 21 is a diagrammatic view showing an example of a display of a rubber band by the wiring CAD apparatus shown in FIG. 10.

6) The display data production section 25 produces, based on position information of a wiring start point and a wiring end point and position information of the mouse pointer all calculated by the position information calculation section 31, display data for a rubber band which can connect an interval between the wiring start position and the position of the mouse pointer and another rubber band which can connect another interval between the mouse pointer and the wiring end point. Based on the display data, on the screen of the display unit 22, for example, as shown in FIG. 21, not only a rubber band 57 similar to that on a conventional display screen is displayed between a wiring start point 54 and a mouse pointer 56, but also, in the present embodiment, another rubber band 58 is displayed between the mouse pointer 56 and a wiring end point 55. It is to be noted that each of the rubber bands 57 and 58 may be such a straight line as seen in FIG. 21 or may alternatively be a curved line such as an arc.

Figure 22:
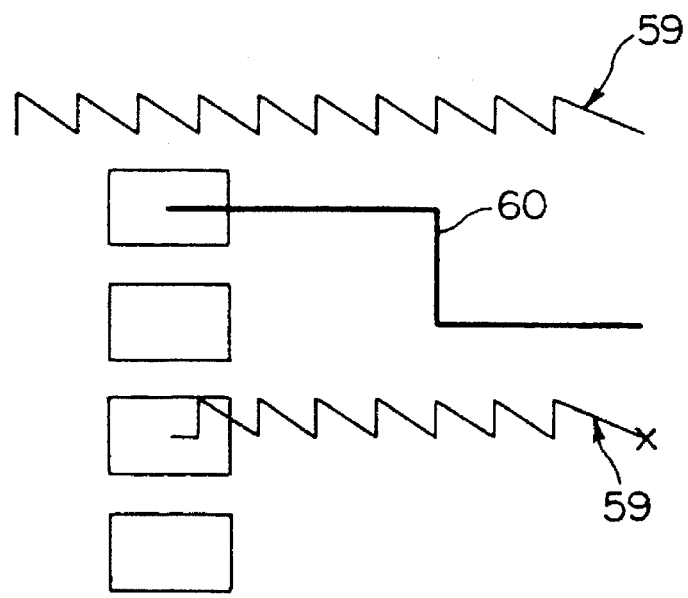
FIG. 22 is a diagrammatic view showing an example of a display of a processing object network by the wiring CAD apparatus shown in FIG. 10.

7) The display data production section 25 produces display data in accordance with which a processing object network (wire group) searched out by the processing object network searching section 30 is to be displayed on the display unit 22 in a visually distinguishable condition from another network (wire group). Based on such display data, on the screen of the display unit 22, for example, as shown in FIG. 22, wiring patterns 59 which belong to an object network for wiring processing or deletion processing are displayed each in a zigzag line while another wiring pattern 60 which belongs to another network is displayed in an ordinary solid line. It is to be noted that, while the processing object network and the other network are displayed in different displaying shapes in the example shown in FIG. 22 in order to allow distinction between them, other displaying shapes may alternatively be employed or the networks may otherwise be displayed in different displaying colors so as to allow distinction between them.

Figure 23:
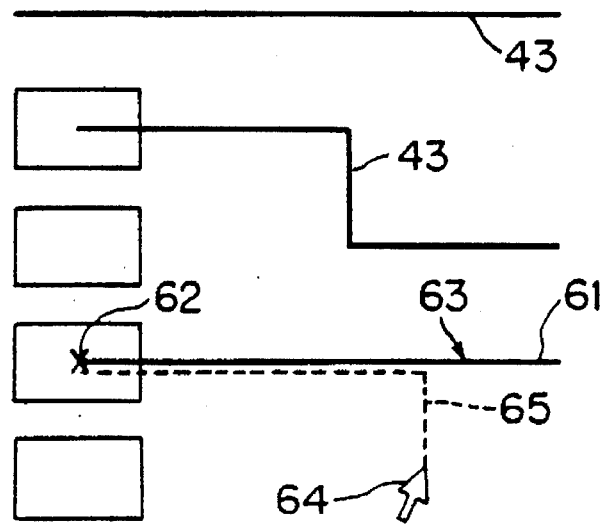
FIG. 23 is a diagrammatic view showing an example of a display of a deletion end point candidate position by the wiring CAD apparatus shown in FIG. 10.

8) The display data production section 25 produces, based on position information of a deletion start point, position information of the mouse pointer and deletion end point candidate position information all calculated by the position information calculation section 31, display data in accordance with which a rubber band is to be displayed to extend from the position of a deletion start point to the position of the mouse pointer by way of a deletion end point candidate position. Based on such display data, on the screen of the display unit 22, for example, as shown in FIG. 23, a rubber band 65 is displayed to extend from a deletion start point 62 along a wiring pattern 61, which belongs to a deletion object network, to a mouse pointer 64 by way of a deletion end point candidate position 63 on the wiring pattern 61. The rubber band 65 may be displayed in such a straight line as seen in FIG. 23 or may alternatively be displayed in a curved line such as an arc. Further, the rubber band 65 may be displayed neighboring the wiring pattern 61 as shown in FIG. 23 or may alternatively be displayed in an overlaid condition on the wiring pattern 61. Furthermore, the deletion start point 62 or the deletion end point candidate position 63 may be displayed together with an additional mark applied thereto in order to clearly indicate the position of it.

Figure 24:
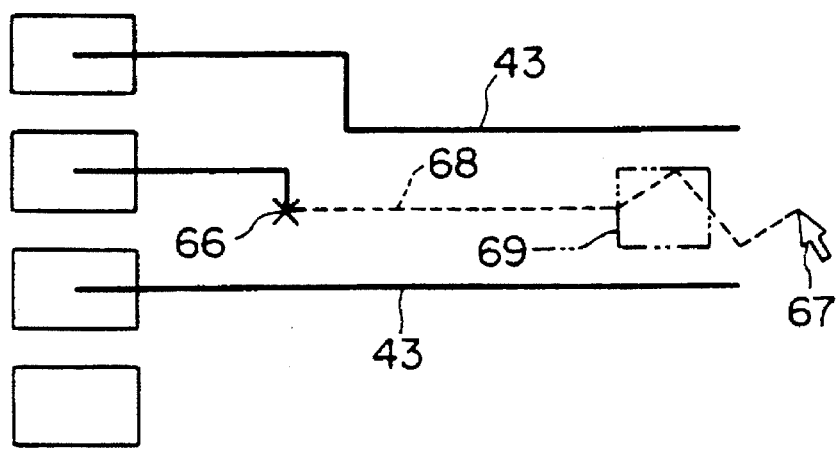
FIG. 24 is a diagrammatic view showing an example of a display by the wiring CAD apparatus shown in FIG. 10 which makes the position of a factor of an obstacle clear by a displaying condition of a rubber band.

9) The display data production section 25 produces, based on position information of a wiring start point and position information of the mouse pointer calculated by the position information calculation section 31, display data in accordance with which a rubber band is to be displayed which can connect an interval from the wiring start point to the position of the mouse pointer, and further produces, when it is determined by the wiring determination section 32 that it is impossible to wire a wiring line between the position of the wiring start point and the position of the mouse pointer, display data in accordance with which a portion of a rubber band which extends from the position of an obstructing factor searched out by the obstructing factor searching section 33 to the position of the mouse pointer is to be displayed in a visually distinguishable condition from the other portion of the rubber band which extends from the position of the wiring start point to the position of the obstructing factor. Based on such display data, on the screen of the display unit 22, for example, as shown in FIG. 24, a rubber band 68 similar to that displayed on a conventional displaying screen is displayed to extend between a wiring start point 66 and a mouse pointer 67. However, when an obstructing factor (obstacle) 69 which cannot be recognized on the screen is present on the wiring interval, the displaying form of the portion of the rubber band 68 which extends from the position of the obstructing factor 69 to the mouse pointer 67 is varied to a zigzag line or the like. It is to be noted that, while, in the example shown in FIG. 24, the displaying form of the rubber band 68 in the interval in which wiring is disabled is varied to a zigzag line, any other suitable displaying form may be employed, or else a different displaying color may be employed.

Figure 25:
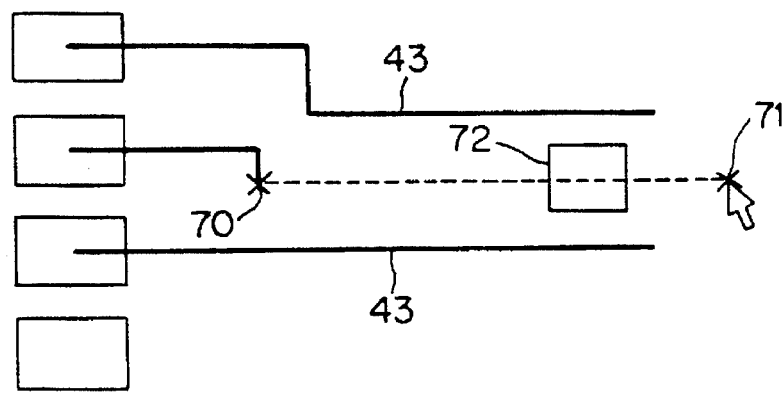
FIG. 25 is a diagrammatic view showing an example of a display of an obstructing factor by the wiring CAD apparatus shown in FIG. 10.
Figure 26:
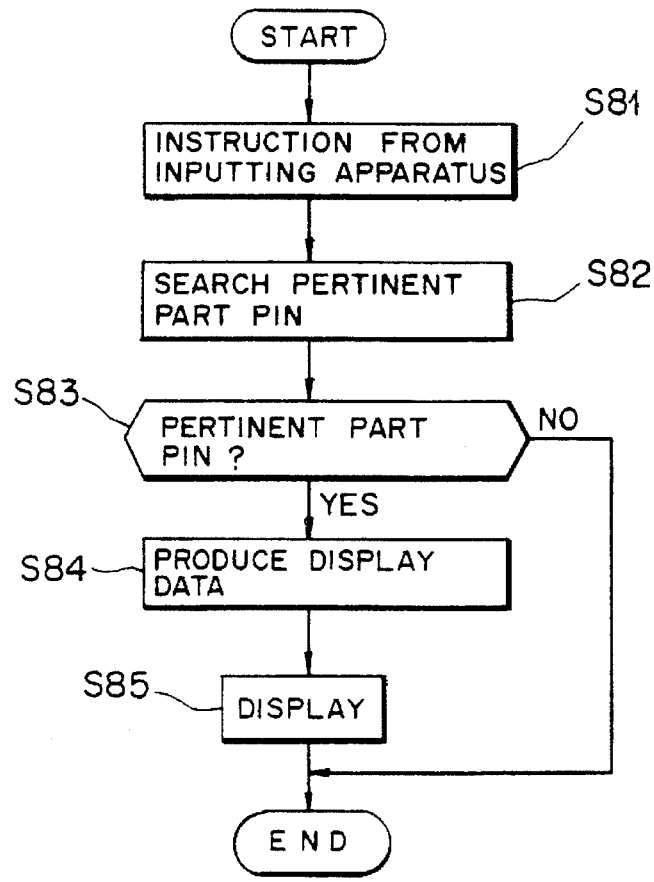
FIG. 26 is a flow chart illustrating a procedure of displaying a non-wired pin by an ordinary wiring CAD apparatus.
Figure 27:
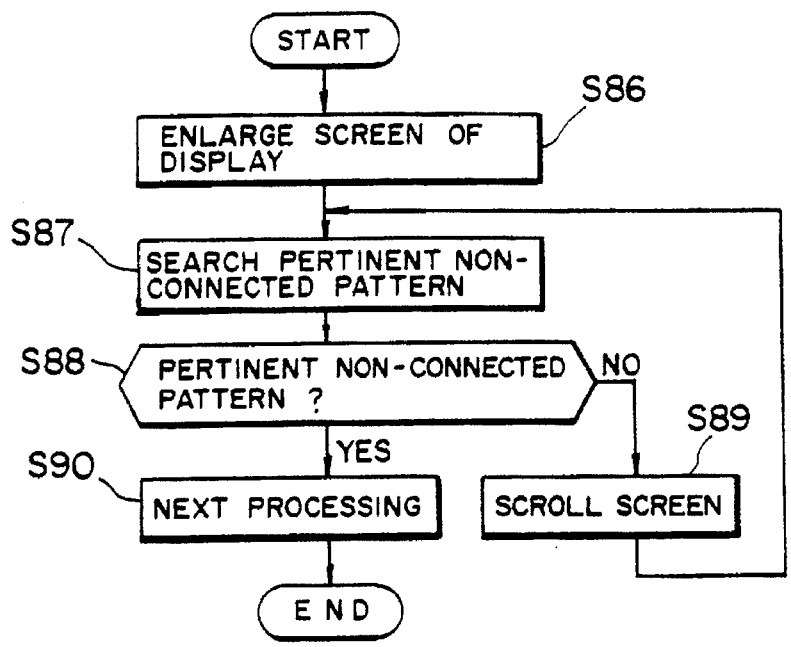
FIG. 27 is a flow chart illustrating a procedure of searching a non-connected pattern by an ordinary wiring CAD apparatus.
Figure 28:
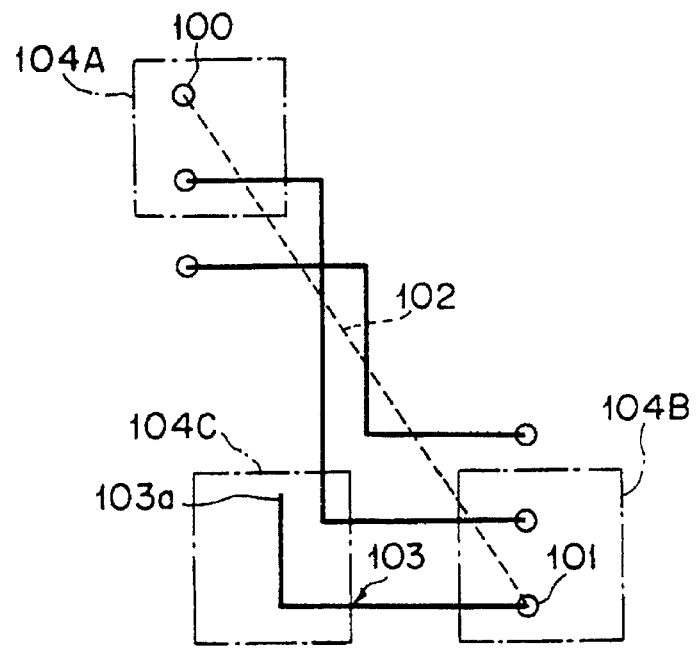
FIG. 28 is a diagrammatic view showing an example of a display of a non-wired pattern by an ordinary wiring CAD apparatus.
Figure 29:
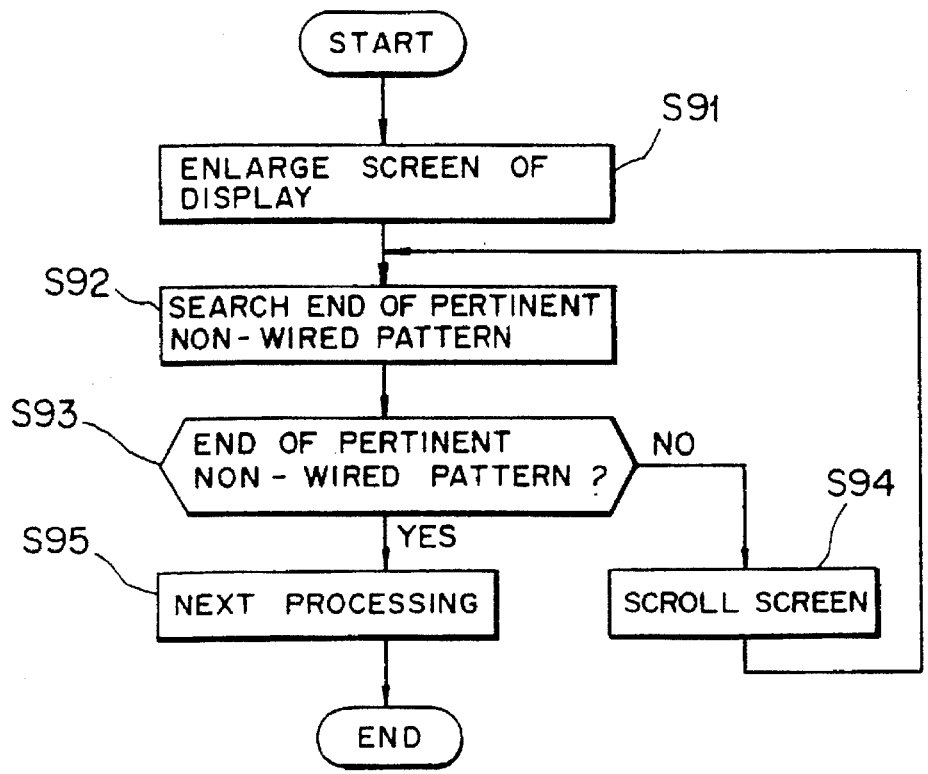
FIG. 29 is a flow chart illustrating a procedure of searching a non-wired pattern by an ordinary wiring CAD apparatus.
Figure 30:
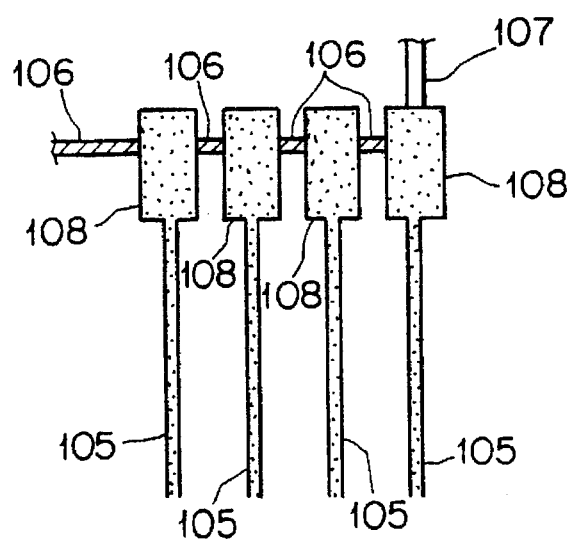
FIG. 30 is a diagrammatic view showing an example of a hierarchic display of wiring patterns by an ordinary wiring CAD apparatus.
Figure 31A:
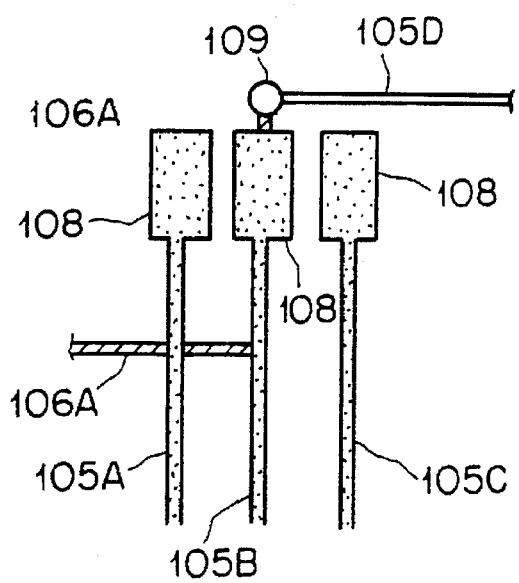
FIGS. 31(a) and 31(b) are diagrammatic views showing another example of a hierarchic display of wiring patterns by an ordinary wiring CAD apparatus.
Figure 31B:
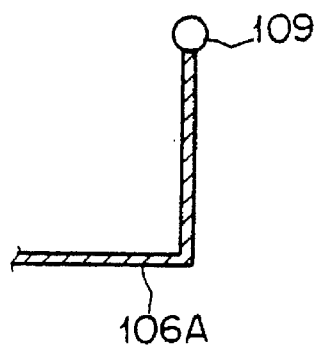
Figure 32:
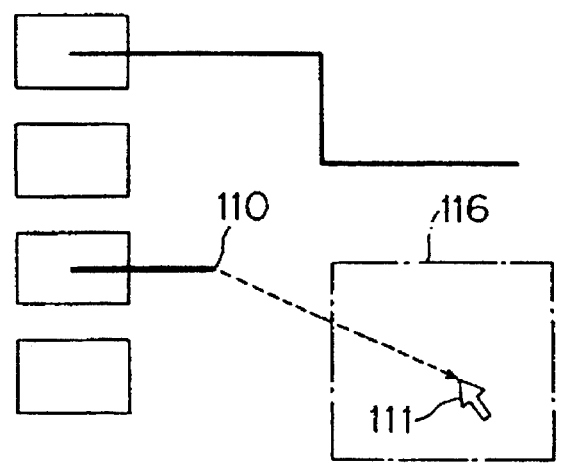
FIG. 32 is a diagrammatic view showing an example of a display of a rubber band by an ordinary wiring CAD apparatus.
Figure 33:
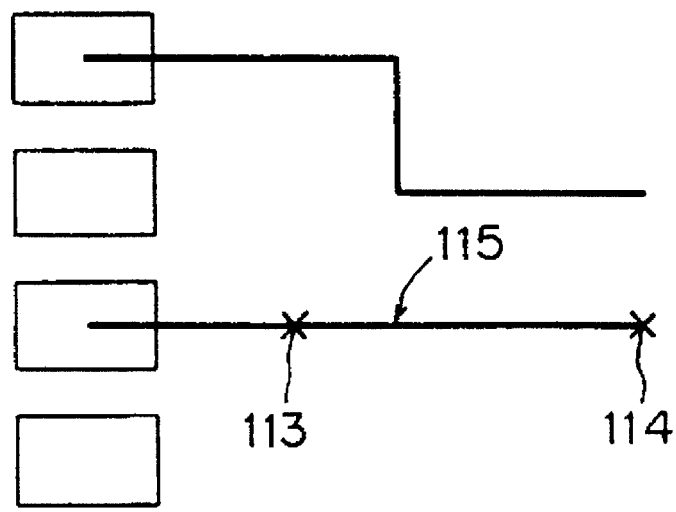
FIG. 33 is a diagrammatic view showing an example of a display upon deletion processing by an ordinary wiring CAD apparatus.

10) The display data production section 25 produces, when it is determined, upon designation of a wiring start point and a wiring end point to determine a wiring interval, by the wiring determination section 32 that wiring in the wiring interval is impossible, display data in accordance with which the position of an obstructing factor (obstacle) searched out by the obstructing factor searching section 33 is to be displayed clearly. Based on such display data, on the screen of the display unit 22, for example, as shown in FIG. 25, when an obstructing factor is present between a wiring start point 70 and a wiring end point 71, the obstructing factor (obstacle) 72 is displayed clearly at the position. In this instance, when the obstructing factor 72 cannot be recognized on the screen (for example, a greater number of wiring patterns than an allowable passing number are present there), the position is indicated by means of some mark clearly. However, when the obstructing factor 72 can be recognized on the screen, it is displayed in a different displaying color or in a different displaying form from that of any other element to indicate it clearly.

Subsequently, operation of the wiring CAD apparatus of the present embodiment having the construction described above will be described with reference to the flow charts shown in FIGS. 11 to 14.

Figure 11:
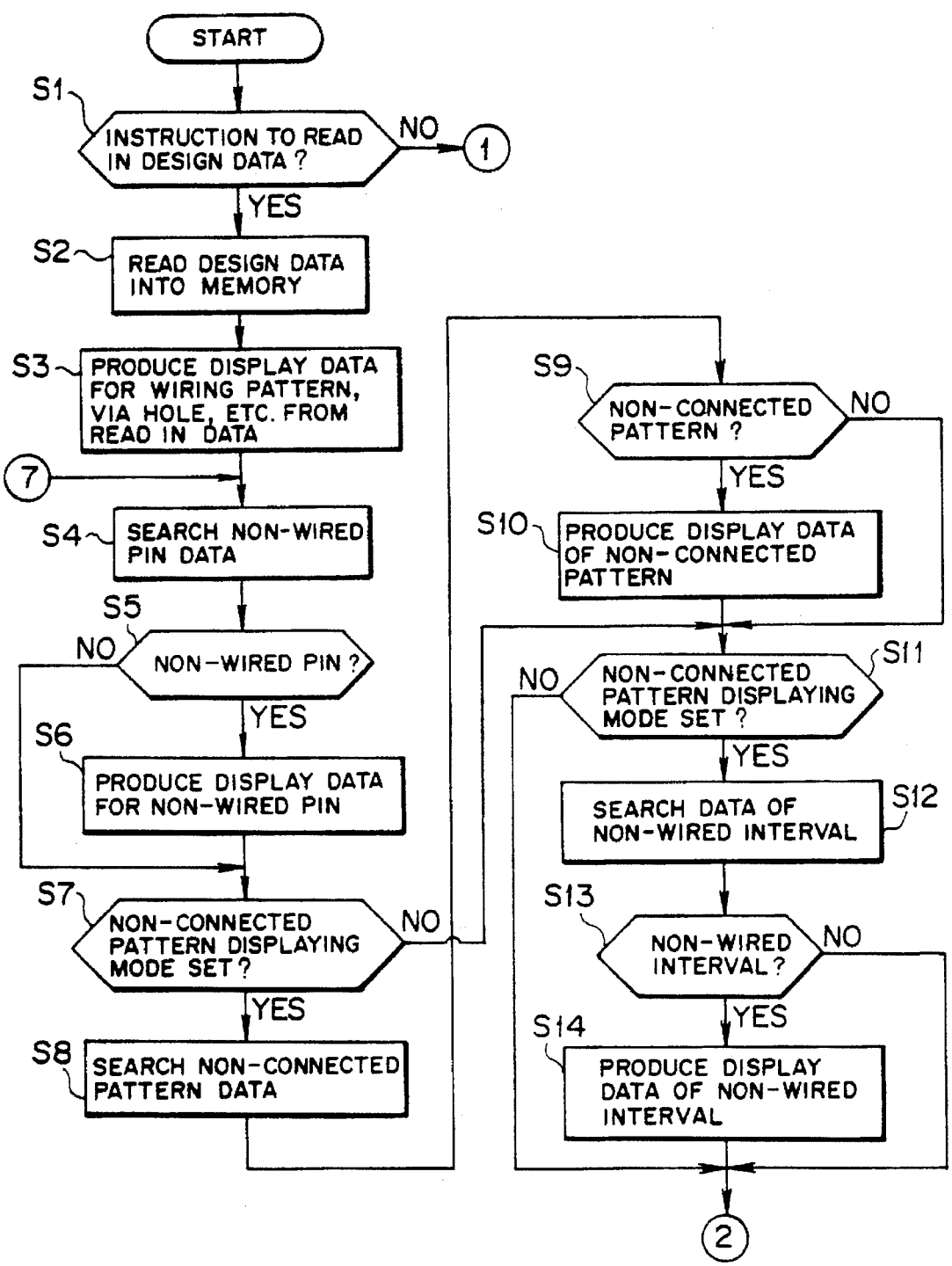
FIGS. 11 to 14 are flow chart illustrating operation of the wiring CAD apparatus shown in FIG. 10.
Figure 12:
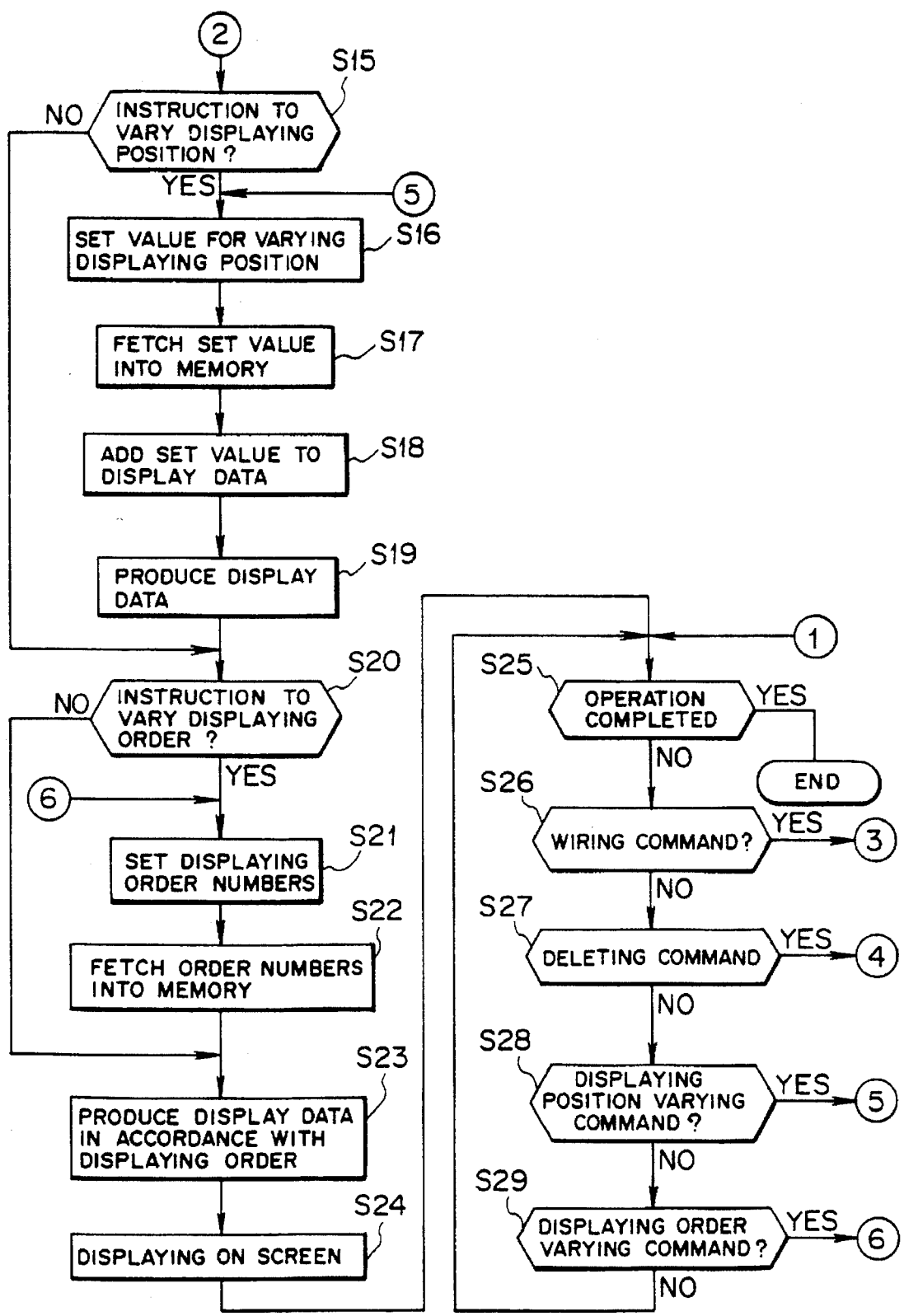

Referring first to FIG. 11, it is first determined whether or not an instruction to read in design data (an instruction to perform new displaying processing) is inputted by way of the inputting apparatus 21 (step S1), and if such instruction is not inputted, then the control sequence advances to step S25 shown in FIG. 12, at which it is determined whether or not the operation is to be ended. However, if the instruction is inputted, then design data are read into the memory 24 (step S2).

Based on the data thus read in, the display data production section 25 produces display data of a wiring pattern or patterns, a via hole or holes (or IVH or IVHs) and/or a part pin or pins (step S3).

In this instance, in the present embodiment, it is detected by the searching timing detection section 26 that the processing in question is new displaying processing, and the non-wired pin searching section 27 thus searches non-wired pin data in the design data (step S4). If a non-wired pin is present (if the determination at step S5 is YES), the display data production section 25 produces display data of, for example, such a non-wired pin as shown in FIG. 15 (step S6).

Thereafter, it is determined whether or not a non-connected pattern displaying mode is set (step S7). If the non-connected pattern displaying mode is set, then the non-connected pattern searching section 28 searches non-connected pattern data from among the design data (step S8), and if a non-connected pattern is present (when the determination at step S9 is YES), the display data production section 25 produces, for example, such display data of a non-connected pattern as shown in FIG. 16 (step S10).

Similarly, it is determined whether or not a non-wired pattern (non-wired interval) displaying mode is set (step S11), and if such displaying mode is set, then the non-connected pattern searching section 28 searches a non-wired interval in the design data (step S12). Then, if a non-wired interval is present (when the determination at step S13 is YES), the display data production section 25 produces, for example, such display data of a non-wired interval as shown in FIG. 17 (step S14).

Referring now to FIG. 12, it is thereafter determined whether or not an instruction to vary the displaying positions for different layers of the wiring patterns is inputted by way of the inputting apparatus 21 (step S15). When the displaying positions should be varied, a value by which the displaying positions are varied or displaced (a suitable displacement amount) is set (step S16), and the value is fetched into the memory 24 (step S17). Thereafter, the display data production section 25 adds the value for variation of the displaying positions to the display data for which the displaying positions should be varied (step S18) and produces, for example, such display data as shown in FIG. 18 (step S19).

Figure 19:
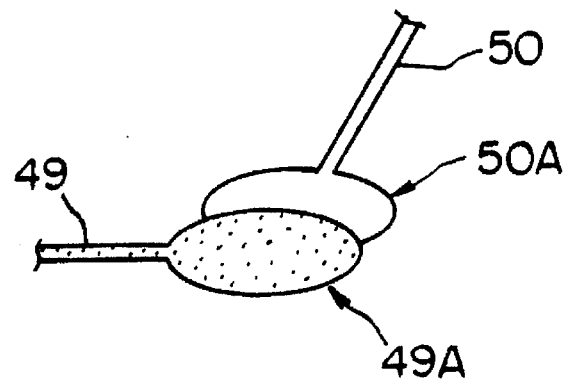
FIG. 19 is a perspective view showing, in an enlarged scale, an example of a display of via holes in a hierarchic displaying condition by the wiring CAD apparatus shown in FIG. 10.

Thereafter, it is determined whether or not an instruction to vary the displaying order of the individual wiring patterns is inputted by way of the inputting apparatus 21 (step S20). When the displaying order should be varied, a series of numbers of a varied displaying order will be set by way of the inputting apparatus 21 (step S21). The series of numbers of the varied displaying order is fetched into the memory 24 (step S22), and the display data production section 25 produces, for example, such display data as shown in FIG. 19 in accordance with the thus set displaying order.

The display data produced in such a manner as described above by the display data production section 25 are displayed on the display unit 22 under the control of the displaying control section 23 (step S24).

After the predetermined display data are produced and displayed once on the display unit 22, it is determined whether or not the operation is completed (step S25). If the operation is not completed, then it is determined at steps S26 to S29 whether instructions of a wiring command, a deleting command, a display position varying command and a displaying order varying command are inputted by way of the inputting apparatus 21, respectively.

Figure 13:
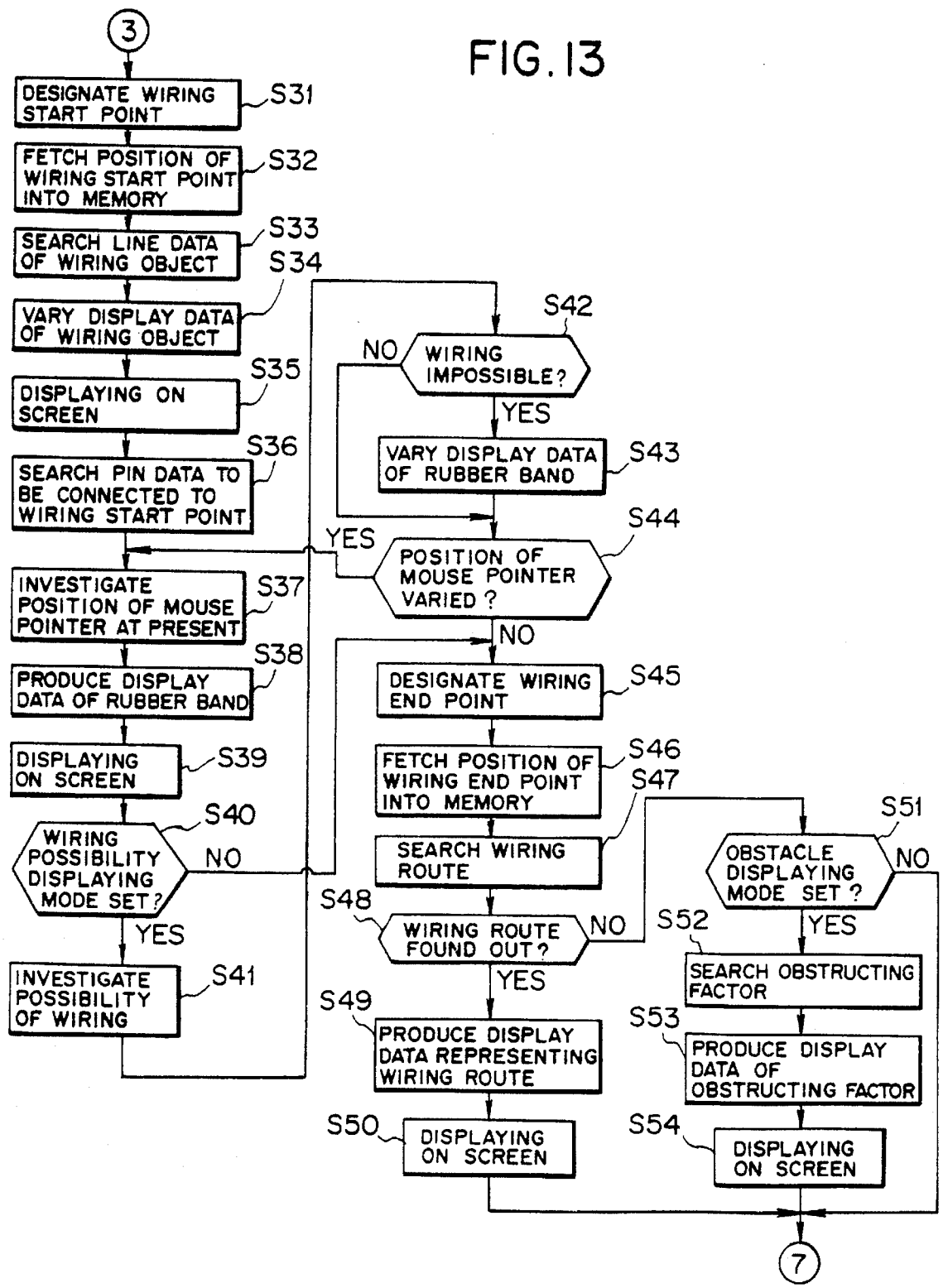
Figure 14:
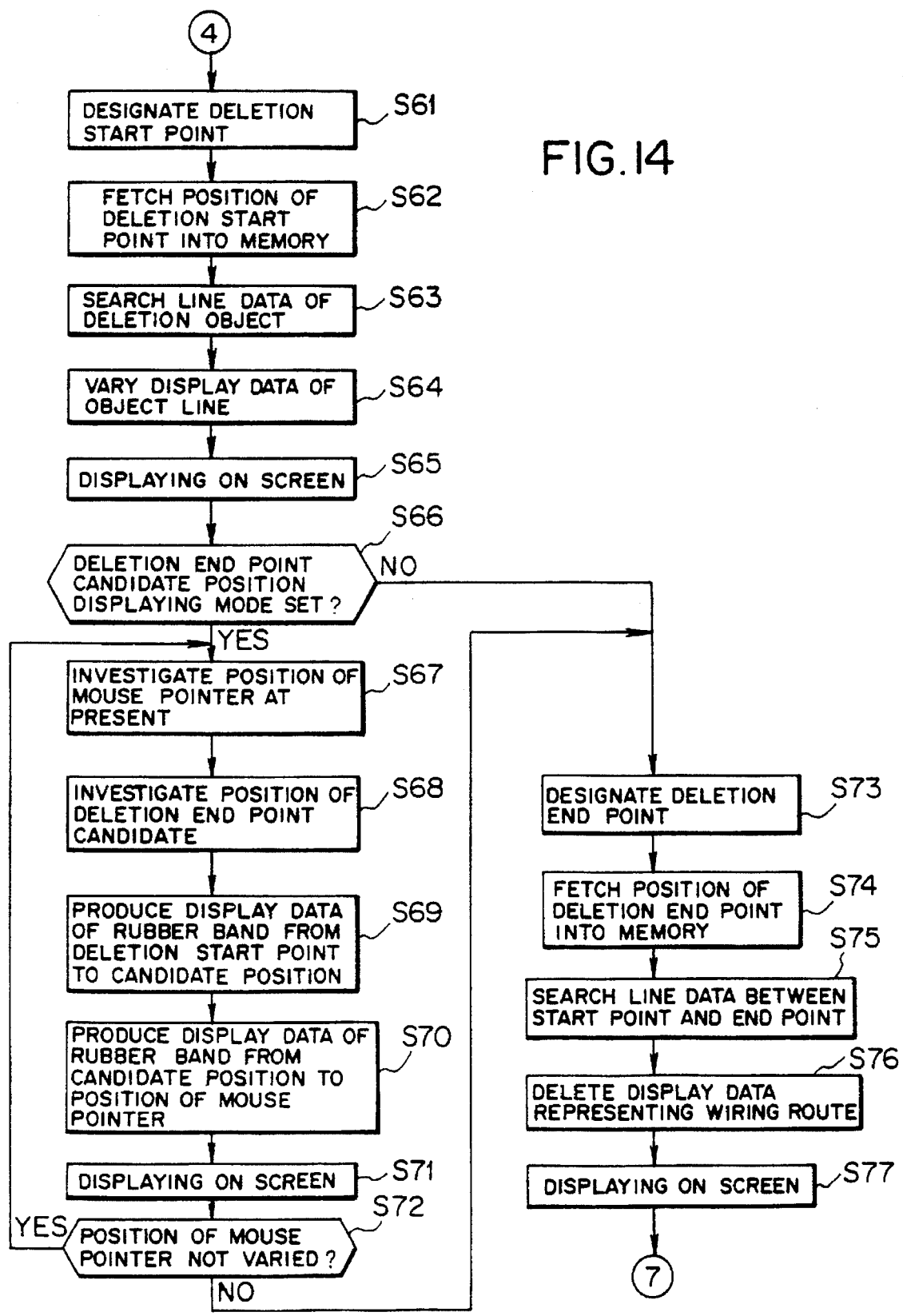

If it is determined at step S26 that an instruction of a wiring command is inputted, the control sequence advances to step S31 of FIG. 13, but if it is determined at step S27 that an instruction of a deleting command is inputted, then the control sequence advances to step S61 of FIG. 14.

On the other hand, if it is determined at step S28 that an instruction of a displaying position varying command is inputted, then the control sequence returns to step S16 of FIG. 12 to perform similar processing to that described hereinabove. Further, if it is determined at step S29 that an instruction of a displaying order varying command is inputted, then the control sequence returns to step S21 of FIG. 12 to perform processing similar to that described hereinabove.

Referring now to FIG. 13, when it is determined at step S26 of FIG. 12 that an instruction of a wiring command is inputted, in the present embodiment, the inputting apparatus 21 will be operated to designate a start point for wiring (wiring start point) on the screen of the display unit 22 (step S31). The position (coordinates) of the start point is calculated by the position information calculation section 31 and fetched into the memory 24 (step S32).

Then, the processing object network searching section 30 searches line data (a network or a wire group) of a wiring object connected to the start point (step S33), and the display data production section 25 varies display data of a line of the object (wiring object network) (step S34). Then, for example, such a screen as shown in FIG. 22 is displayed on the display unit 22 (step S35).

Thereafter, data of a part pin (wiring end point) to be connected to the wiring start point designated in such a manner as described above is searched (step S36). Then, the position information calculation section 31 detects the position of the mouse pointer (cursor) at present on the screen of the display unit 22 (step S37).

In order to display a rubber band which interconnects the wiring start point fetched in the memory 24 and the position of the mouse pointer at present and another rubber band which interconnects the position of the mouse pointer at present and the wiring end point searched out, the display data production section 25 produces, for example, such display data as shown in FIG. 21 (step S38), and the display data are displayed on the screen of the display unit 22 (step S39).

Then, it is determined whether or not a wiring possibility real time displaying mode is set (step S40). If the displaying mode is set, then the wiring determination section 32 investigates whether or not wiring is possible between the wiring start point and the position of the mouse pointer at present (step S41).

When the wiring is impossible (when the determination at step S42 is YES), the obstructing factor searching section 33 searches the position (position of an obstructing factor) at which the wiring is disabled, and the display data production section 25 varies the display of a portion of the rubber band from the position at which the wiring is disabled to the position of the mouse pointer at present so that, for example, such a screen as shown in FIG. 24 is displayed on the display unit 22 (step S43).

When the determination at step S42 is NO, or when the processing at step S43 is completed, it is thereafter determined whether or not the position of the mouse pointer has changed (step S44), and if the position has changed, then the control sequence returns to step S37 to repetitively perform similar processing to that described above.

On the contrary when it is determined at step S44 that the position of the mouse pointer has not changed, or when it is determined at step S40 that the wiring possibility real time displaying mode is not set, the inputting apparatus 21 will be operated to designate an end point for wiring (wiring end point) on the screen of the display unit 22 (step S45). The position (coordinates) of the end point is calculated by the position information calculation section 31 and fetched into the memory 24 (step S46).

Then, a wiring route interconnecting the wiring start point and the wiring end point is searched (step S47), and it is determined whether or not a wiring route has been found out successfully (step S48). If a wiring route has been found out successfully, then the display data production section 25 produces display data for displaying the wiring route (step S49), and the display data are displayed on the screen of the display unit 22 (step S50).

On the contrary, if no wiring route has been found out successfully, or in other words, when some obstructing factor (obstacle) is present in the wiring interval between the wiring start point and the wiring end point, it is determined whether or not an obstacle displaying mode is set (step S51). If such displaying mode is set, then the obstructing factor searching section 33 searches the position at which the wiring is disabled (the position of the obstructing factor) (step S52), and then the display data production section 25 produces display data of the obstructing element (step S53). Thus, for example, such a screen as shown in FIG. 25 is displayed on the display unit 22 (step S54).

After the processing at step S50 or step S54 is completed, or when it is determined at step S51 that the obstacle displaying mode is not set, the control sequence returns to step S4 of FIG. 11 to repetitively perform similar processing to that described hereinabove.

Referring now to FIG. 14, when it is determined at step S27 of FIG. 12 that an instruction of a deleting command is inputted, in the present embodiment, the inputting apparatus 21 will first be operated to designate a start point for deletion (deletion start point) on the screen of the display unit 22 (step S61). The position information calculation section 31 thus calculates the position (coordinates) of the start point, and the position is fetched into the memory 24 (step S62).

Then, the processing object network searching section 30 searches line data (a network or a wire group) of an object of deletion connected to the start point (step S63), and the display data production section 25 modifies display data of the object line (deletion object network) (step 64). Then, for example, such a screen as shown in FIG. 22 is displayed on the display unit 22 (step S65).

Thereafter, it is determined whether or not a real time displaying mode for a deletion end point candidate position is set (step S66), and if such displaying mode is set, then the position information calculation section 31 investigates the position of the mouse pointer (cursor) at present on the screen of the display unit 22 (step S67). Then, the position information calculation section 31 calculates, as a deletion end point candidate position, the position of data of a line (deletion object network) which is an object of deletion and is nearest to the position of the mouse pointer at present (step S68).

Then, the display data production section 25 produces display data for displaying a rubber band which interconnects the deletion start point fetched in the memory 24 and the deletion end point candidate position (step S69) and then produces display data for displaying another rubber band which interconnects the deletion end point candidate position and the position of the mouse pointer at present (step S70). Consequently, for example, such a screen as shown in FIG. 23 is displayed on the display unit 22 (step S71).

After such screen is displayed, it is determined whether or not the position of the mouse pointer has changed (step S72), and if the position has changed, then the control sequence returns to step S67 to repetitively perform similar processing to that described above.

On the other hand, if it is determined at step S72 that the position of the mouse pointer has not changed or it is determined at step S66 that the real time displaying mode for a deletion end point candidate position is not set, the inputting apparatus 21 will be operated to designate an end point for deletion (deletion end point) on the screen of the display unit 22 (step S73). The position (coordinates) of the end point is thus calculated by the position information calculation section 31 and fetched into the memory 24 (step S74).

Then, data of a line between the deletion start point and the deletion end point is searched (step S75), and display data representing a wiring route of the interval between the deletion start point and the deletion end point is deleted (step S76). Then, a screen is displayed on the display unit 22 based on the display data after such deletion (step S77), and thereafter, the control sequence returns to step S4 of FIG. 11 to repetitively perform similar processing to that described hereinabove.

In this manner, with the wiring CAD apparatus of the embodiment of the present invention, a non-wired pin, a non-connected pattern, a non-wired pattern, a wiring pattern or a via hole which extends between a plurality of layers, the direction from the mouse pointer to a wiring end point, a processing object network, a deletion end point candidate position, a wiring enabled area and/or an obstructing factor position can be identified at a moment on the display unit 22. Consequently, the designer can proceed with optimum wiring designing (wiring processing, deletion processing and so forth) grasping a wiring situation with certainty. Accordingly, the wiring CAD apparatus is advantageous in that the operability is improved very much and the time required for wiring designing can be reduced remarkably.

It is to be noted that, while, in the embodiment described above, the display data production section 25 has the functions of producing all of the display data described in the items 1) to 10) hereinabove, it is apparent that the advantage in improvement in operability and reduction in wiring designing time can be achieved even if the wiring CAD apparatus includes at least one of the functions.

The present invention is not limited to the specifically described embodiment, and variations and modifications may be made without departing from the scope of the present invention.

What is claimed is:

1. A wiring CAD apparatus, comprising:
    a display section for interactively displaying a wiring design based on display data;
    a displaying control section for controlling said display section;
    a searching timing detection section for identifying a searching timing for a non-wired pin which is a part pin not wired on the wiring design, the searching timing being one of a new displaying processing timing at which a new wiring design is to be displayed on said display section and a deletion processing timing at which part of the current wiring design displayed on said display section is to be deleted;
    a non-wired pin searching section operable in response to the searching timing for identifying the non-wired pin on the wiring design object from among the display data; and
    a display data production section for producing display data for displaying the identified non-wired pin on said display section in a visually distinguishable condition from another already wired part pin;
    the display data produced by said display data production section being displayed on said display section via said displaying control section.

2. A wiring CAD apparatus, comprising:
    a display section for interactively displaying a wiring design based on display data;
    a displaying control section for controlling said display section;
    a non-connected pattern searching section for identifying, from among the display data, a non-connected pattern which is a wiring pattern not connected to any element on the wiring design; and
    a display data production section for producing display data for displaying the identified non-connected pattern on said display section in a visually distinguishable condition from any other wiring pattern;
    the display data produced by said display data production section being displayed on said display section via said displaying control section.

3. The wiring CAD apparatus as claimed in claim 2, wherein said display data production section produces display data for displaying a mark clearly indicating an end of the identified non-connected pattern on said display section at each of the opposite ends of the non-connected pattern.

4. A wiring CAD apparatus, comprising:
    a display section for interactively displaying a wiring design based on display data;
    a displaying control section for controlling said display section;
    a non-wired pattern searching section for identifying, from among the display data to said display section, a non-wired pattern which is a wiring pattern which forms a non-wired interval on the wiring design; and
    a display data production section for producing display data for displaying a line interconnecting an end of the identified non-wired pattern and a part pin to which the non-wired pattern is to be connected is to be displayed on said display section;
    the display data produced by said display data production section being displayed on said display section via said displaying control section.

5. The wiring CAD apparatus as claimed in claim 4, wherein said display data production section produces display data for displaying a mark clearly indicating an end of the identified non-wired pattern at the end of the non-wired pattern.

6. A wiring CAD apparatus, comprising:
    a display section for interactively displaying a wiring design based on display data;
    a displaying control section for controlling said display section; and
    a display data production section for producing display data for displaying a wiring design condition of each of the plurality of layers which are to be displayed at positions displaced from each other, to allow wiring design conditions of a plurality of layers to be displayed simultaneously in a hierarchically overlapping relationship on said display section;
    the display data produced by said display data production section being displayed on said display section via said displaying control section.

7. The wiring CAD apparatus as claimed in claim 6, further comprising a hierarchic displaying order designation section for designating a hierarchic displaying order of the wiring design conditions of the plurality of layers, said display data production section producing display data in accordance with the hierarchic displaying order designated by said hierarchic displaying order designation section.

8. A wiring CAD apparatus, comprising:

a display section for interactively displaying a wiring design based on display data;

a displaying control section for controlling said display section;

a position information calculation section operable when adding a wiring pattern to the wiring design displayed, said position information calculation section calculating position information of a start point and an end point of the wiring pattern and position information of a pointer displayed on said display section to designate the position at which the wiring pattern is to be arranged; and a display data production section for producing, based on the position information of the start point an the end point of the wiring pattern and the position information of the pointer calculated by said position information calculation section, display data of a rubber band by which an interval from the start point of the wiring pattern to the position of the pointer can be connected and another rubber band by which another interval from the position of the pointer to the end point of the wiring pattern can be connected;

the display data produced by said display data production section being displayed on said display section via said displaying control section.

9. A wiring CAD apparatus, comprising:

a display section for interactively displaying a wiring design based on display data;

a displaying control section for controlling said display section;

a processing object network searching section operable when adding a wiring pattern to the wiring design displayed on said display section and when deleting part of the wiring design displayed on said display section, said processing object network searching section identifying a processing object network including a processing start point designated by a pointer displayed on said display section from among the display data; and a display data production section for producing display data for displaying the processing object network identified by said processing object network searching section on said display section in a visually distinguishable condition from any other network;

the display data produced by said display data production section being displayed on said display section via said displaying control section.

10. A wiring CAD apparatus, comprising:

a display section for interactively displaying a wiring design based on display data;

a displaying control section for controlling said display section;

a position information calculation section operable when deleting part of the wiring design displayed on said display section, said position information calculation section calculating position information of a deletion start point designated by a pointer displayed on said display section and position information of the pointer and calculating a position which is nearest to the position of the pointer on a deletion object network including the deletion start point as deletion end point candidate position information; and a display data production section for producing, based on the position information of the deletion start point, the position information of the pointer and the deletion end point candidate position information calculated by said position information calculation section, display data of a rubber band which is to be displayed as extending from the position of the deletion start point to the position of the pointer past the deletion end point candidate position;

the display data produced by said display data production section being displayed on said display section via said displaying control section.

11. A wiring CAD apparatus, comprising:

a display section for interactively displaying a wiring design based on display data;

a displaying control section for controlling said display section;

a position information calculation section operable when adding a wiring pattern to the wiring design displayed on said display section, said position information calculation section calculating position information of a wiring start point designated by a pointer displayed on said display section and position information of the pointer;

a wiring determination section for successively determining, based on the position information of the wiring start point and the position information of the pointer calculated by said position information calculation section, whether a wiring line between the position of the wiring start point and the position of the pointer can be wired;

an obstructing factor searching section operable when it is determined by said wiring determination section that it is impossible to wire a wiring line between the position of the wiring start point and the position of the pointer for identifying the position of an obstructing factor at which the wiring is disabled; and a display data production section for producing, based on the position information of the wiring start point and the position information of the pointer calculated by said position information calculation section, display data of a rubber band by which an interval from the wiring start point to the position of the pointer can be connected and for producing, when it is determined by said wiring determination section that it is impossible to wire a wiring line between the position of the wiring start point and the position of the pointer, display data for displaying a portion of the rubber band extending from the position of the obstructing factor, searched out by said obstructing factor searching section, to the position of the pointer in a visually distinguishable condition from the other portion of the rubber band extending from the position of the wiring start point to the position of the obstructing factor;

the display data produced by said display data production section being displayed on said display section via said displaying control section.

12. A wiring CAD apparatus, comprising:

a display section for interactively displaying a wiring design based on display data;

a displaying control section for controlling said display section;

a position information calculation section operable when adding a wiring pattern to the wiring design displayed on said display section, said portion information calculation section calculating position information of a wiring start point and position information of a wiring end point designated by a pointer displayed on said display section;

a wiring determination section for determining, based on the position information of the wiring start point and the position information of the wiring end point calculated by said position information calculation section, whether a wiring line between the position of the wiring start point and the position of the wiring end point can be wired;

an obstructing factor searching section for identifying, when it is determined by said wiring determination section that it is impossible to wire a wiring line between the wiring start point and the wiring end point, the position of an obstructing factor which renders the wiring impossible; and a display data production section for producing display data for displaying the position of the obstructing factor identified by said obstructing factor searching section clearly;

the display data produced by said display data production section being displayed on said displayed section via said displaying control section.

* * * * *